United States Patent
Kato et al.

(10) Patent No.: US 6,333,879 B1
(45) Date of Patent: Dec. 25, 2001

(54) SEMICONDUCTOR DEVICE OPERABLE IN A PLURALITY OF TEST OPERATION MODES

(75) Inventors: Tetsuo Kato; Kei Hamade, both of Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/226,155

(22) Filed: Jan. 7, 1999

(30) Foreign Application Priority Data

Jun. 11, 1998 (JP) .................................................. 10-163746

(51) Int. Cl.$^7$ ...................................................... G11C 7/00
(52) U.S. Cl. ......................... 365/201; 365/202; 365/191; 365/193
(58) Field of Search ..................................... 324/760, 763, 324/158.1; 365/201, 193, 191; 371/221; 65/201

(56) References Cited

U.S. PATENT DOCUMENTS

| | | | |
|---|---|---|---|
| 5,365,481 | * 11/1994 | Sawada | 365/201 |
| 5,590,080 | * 12/1996 | Hasagawa et al. | 365/201 |
| 5,689,467 | * 11/1997 | Hashimoto | 365/201 |
| 5,748,544 | * 5/1998 | Hashimoto | 365/201 |
| 5,818,768 | * 10/1998 | Sawada et al. | 365/193 |
| 5,848,017 | * 12/1998 | Bissey | 365/201 |
| 5,870,342 | * 2/1999 | Fukuda | 65/201 |
| 5,878,051 | * 3/1999 | Sharma et al. | 371/22.1 |
| 6,067,258 | * 5/2000 | Kwak | 365/191 |
| 6,094,387 | * 7/2000 | Mine et al. | 365/201 |

FOREIGN PATENT DOCUMENTS

| | | |
|---|---|---|
| 3-160699 | 7/1991 | (JP) . |
| 7-57472 | 3/1995 | (JP) . |
| 9-185900 | 7/1997 | (JP) . |
| 10-21698 | 1/1998 | (JP) . |

* cited by examiner

Primary Examiner—Glenn W. Brown
Assistant Examiner—Jimmy Nguyen
(74) Attorney, Agent, or Firm—McDermott, Will & Emery

(57) ABSTRACT

A circuit generating a test mode instructing signal includes a test mode register circuit which is set to a state disabling instruction of a test mode in a standby state. An intended test mode can be accurately selected even when the test mode is instructed in accordance with a plurality of external signals varied in timing from each other. A semiconductor device allows accurate and efficient execution of the test without requiring increase in area occupied by an array.

13 Claims, 14 Drawing Sheets

F I G. 3 2
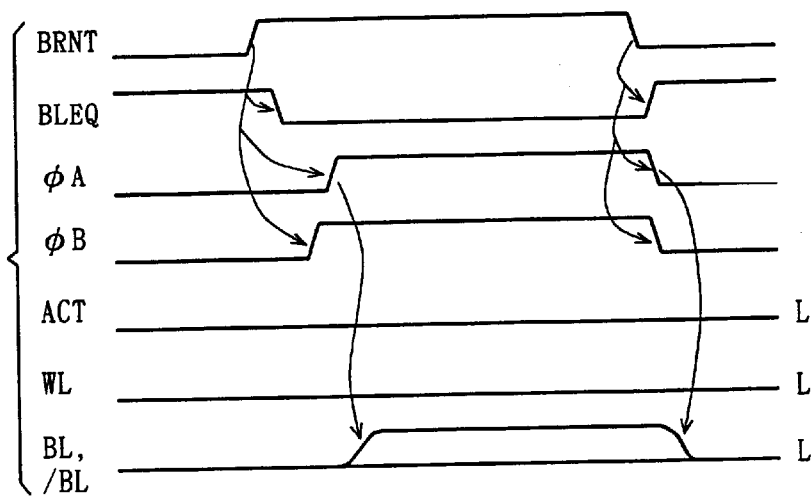
F I G. 3 3
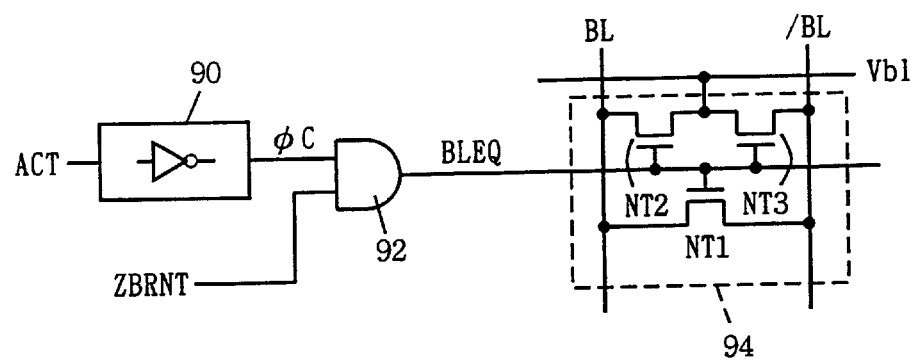
F I G. 3 4
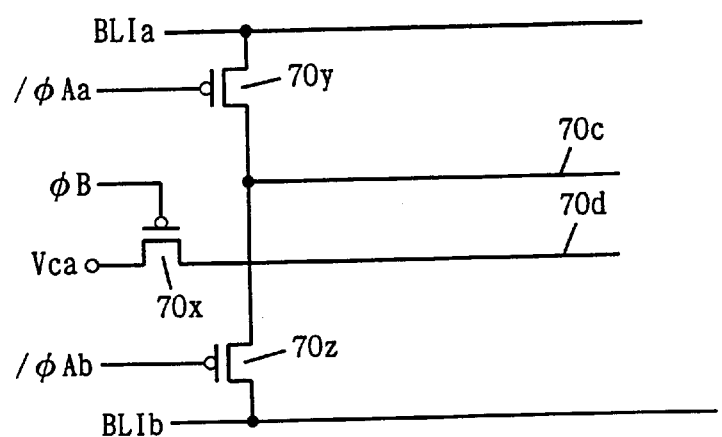

SEMICONDUCTOR DEVICE OPERABLE IN A PLURALITY OF TEST OPERATION MODES

BACKGROUND OF THE INVENTION

1. Field of the Invention

The present invention relates to a semiconductor device, and particularly to a structure for testing the semiconductor device.

2. Description of the Background Art

For ensuring the reliability of products, various tests are performed on semiconductor devices. The tests of semiconductor device include a test at a wafer level and a test on a packaged device prior to shipment. For operations in various kinds of test modes, the semiconductor device is provided with circuit elements corresponding to the respective test modes. These circuit elements are selectively set to appropriate states in accordance with a designated test mode so that short-circuiting between internal nodes, change of an operation mode and others are performed. The test at the wafer level specifically includes a test for determining whether an internally produced reference voltage is set at a predetermined voltage level or not, and a performance evaluating test for determining whether internal circuits of the semiconductor device satisfy predetermined operation characteristics or not. Final tests after packaging specifically includes a screening test (voltage stress accelerated test) for revealing a latent defect.

The types of tests made on the semiconductor device increase with increase in integration density and number of functions of the semiconductor device. Increase in number of the types of test modes results in increase in number of corresponding circuit elements and therefore increase in area of the chip occupied by the circuit elements dedicated to the test operations so that the chip area increases, and the cost increases.

Various test modes are designated by combinations of states of a plurality of signals (e.g., WCBR+super VIH+ address key). In this case, a designated test mode must be accurately determined, and the device must be set to the state corresponding to the designated test mode. If the device is set to an erroneous test mode state, an intended test could not be performed and the performance evaluation of the semiconductor device could not be made accurately.

Voltage acceleration is performed for accelerated tests such as a life test or a screening test of the product. In the case of the voltage acceleration, the voltage acceleration must be performed efficiently for reducing a test time. For example, if an internal power supply voltage is changed in accordance with an external power supply voltage in a semiconductor memory device, an internal voltage higher than the internal power supply voltage also rises. Therefore, the internal power supply voltage can be raised only to a restricted level because break down voltage must be ensured in portions receiving the internal voltage. This results in a problem that voltage acceleration on all the internal nodes cannot be performed efficiently.

Further, screening must be effected on various portions by voltage acceleration for ensuring the reliability.

SUMMARY OF THE INVENTION

An object of the invention is to provide a semiconductor device which allows accurate execution of intended tests without increase in chip area.

Another object of the invention is to provide a semiconductor device including a test circuit with a high circuit utilizing efficiency.

A further object of the invention is to provide a semiconductor device allowing accurate setting of intended test modes.

Still another object of the invention is to provide a semiconductor device in which voltage stress acceleration can be efficiently performed on an intended node.

According to the invention, a semiconductor device includes a circuit for generating first and second internal test mode instructing signals in response to an externally applied test mode instructing signal; a circuit for taking in an externally applied address signal and generating a test address signal in response to the first internal test mode instructing signal; and a test mode activating circuit for operating in accordance with the second internal test mode instructing signal and the test address signal to generate a test mode select signal for activating a test mode designated by the test address signal among a plurality of test modes.

The test address signal generating circuit includes a circuit for initializing the test address signal to a state different from the state for selecting one of the plurality of test modes.

By initializing the test address signal to the state different from the test mode instructing state, an intended test mode can be accurately activated even if the plurality of signals are varied in timing.

Further, by utilizing a tuning signal line in another test mode, the circuit utilizing efficiency is improved, and the area of the chip occupied by the test circuit is reduced.

By transmitting an internal voltage other than a sense power supply voltage to a sense power supply node of sense amplifiers, it is possible to perform voltage stress acceleration on each node of the sense amplifiers at a desired speed in a test operation mode.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 2 shows operation waveforms of the circuit shown in FIG. 2A;

FIG. 32 is a signal waveform diagram representing an operation of a modification 2 of the semiconductor device according to the embodiment 3 of the invention;

FIG. 33 schematically shows a structure of a bit line isolation instructing signal generating portion shown in FIG. 32;

FIG. 34 schematically shows a structure of a main portion of a modification 3 of the semiconductor device according to the embodiment 3 of the invention;

DESCRIPTION OF THE PREFERRED EMBODIMENTS

Figure 1:
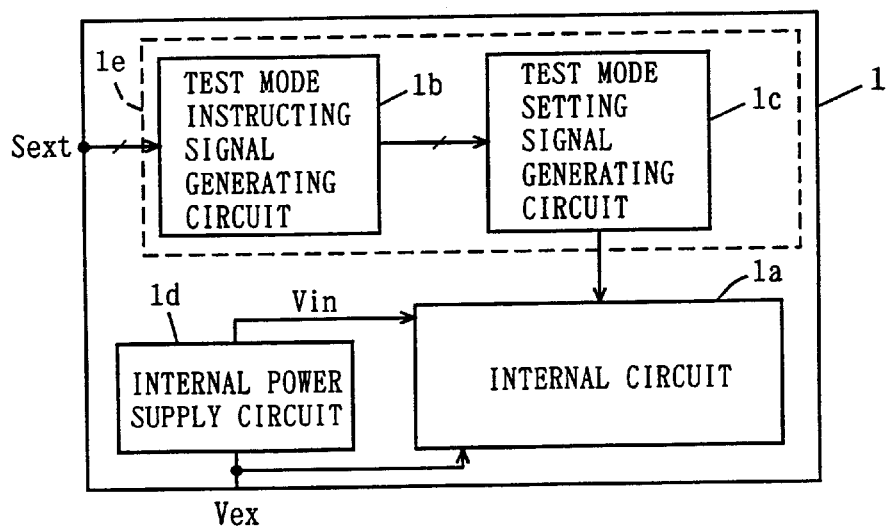
FIG. 1 schematically shows a whole structure of a semiconductor device according to the invention.

FIG. 1 schematically shows a whole structure of a semiconductor device according to the invention. In FIG. 1, a semiconductor device 1 includes an internal circuit 1a implementing predetermined functions, a test mode instructing signal generating circuit 1b which generates a test mode instructing signal in accordance with an externally applied signal Sext, and a test mode setting signal generating circuit 1c which generates a test mode setting signal for setting internal circuit 1a to a test mode instructed in accordance with test mode instructing signal from test mode instructing signal generating circuit 1b.

Externally applied signal Sext is usually formed of multiple bits, and designates a specific test mode in accordance with a combination of logic states of the multiple bits. Test mode setting signal generating circuit 1cgenerates a test mode setting signal for placing internal circuit 1a in the test mode designated in accordance with the test mode instructing signal from test mode instructing signal generating circuit 1b.

Semiconductor device 1 further includes an internal power supply circuit 1d which receives an externally supplied power supply voltage Vex and generates an internal voltage Vin. Internal circuit 1a is supplied with internal voltage Vin from internal power supply circuit 1d and external power supply voltage Vex. Internal voltage Vin supplied from internal power supply circuit 1d may be an operation power supply voltage of internal circuit 1a, a high voltage higher than the operation power supply voltage or a negative voltage.

In the semiconductor device shown in FIG. 1, external signal Sext is set to a predetermined state, whereby the test mode is specified. Test mode instructing signal generating circuit 1b generates a test mode instructing signal, instructing the specified test mode to test mode setting signal generating circuit 1c. Test mode setting signal generating circuit 1c places internal circuit 1a in the test state in accordance with the test mode instructing signal, and the test operation of internal circuit 1a is performed under this state.

Test mode instructing signal generating circuit 1b and test mode setting signal generating circuit 1c form a test mode setting circuit 1e. Internal circuit 1a is set to the state in which it can operate in the specified test mode, by test mode setting circuit 1e in accordance with externally applied signal Sext.

In this test mode setting circuit 1e, test mode setting signal generating circuit 1c arranged therein is commonly used for a plurality of test modes. Test mode setting signal generating circuit 1c produces the test mode setting signal for accurately setting internal circuit 1a to the test mode state designated in accordance with the external signal, when test mode instructing signal generating circuit 1b is active.

Test mode setting signal generating circuit 1c sets internal circuit 1a to the state for efficiently performing the voltage acceleration. Respective structures will now be described below.

[Embodiment 1]

Figure 2A:
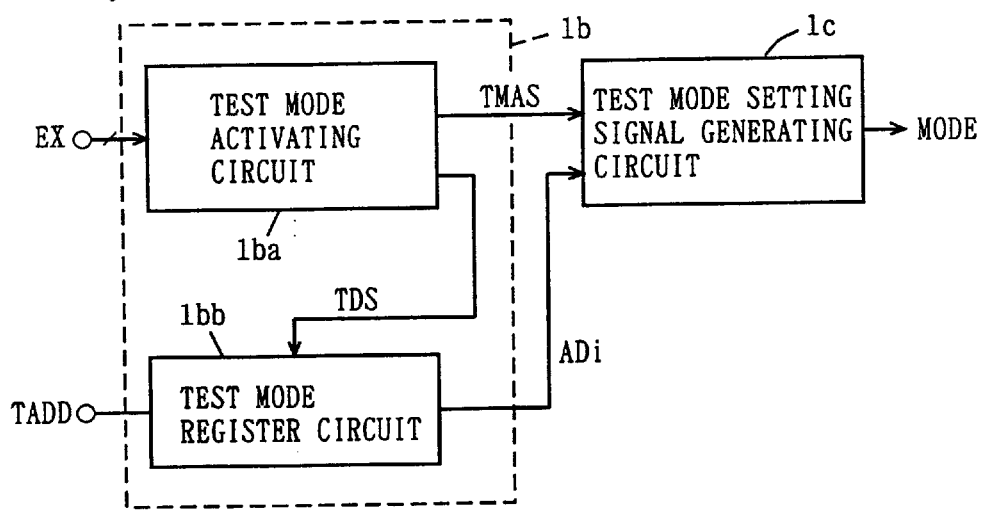
FIG. 2 shematically shows a structure of a main portion of the semiconductor device according to an embodiment 1 of the invention.

FIG. 2A schematically shows a structure of a main portion of a semiconductor device according to an embodiment 1 of the invention. More specifically, FIG. 2A schematically shows a structure of the test mode setting circuit shown in FIG. 1. In FIG. 2A, test mode instructing signal generating circuit 1b includes a test mode activating circuit 1ba which asserts a test address setting signal TDS, i.e., a first test mode instructing signal and a test mode address defining signal TMAS, i.e., a second internal test mode instructing signal when externally applied signal EX is set to a predetermined state, a test mode register circuit 1*bb* which takes in and latches an externally applied test address signal bit TADB in accordance with test address setting signal TDS from test mode activating circuit 1*ba* for generating an internal test address signal bit ADi.

Test mode setting signal generating circuit 1*c* is enabled in response to activation of test mode address defining signal TMAS from test mode activating circuit 1*ba,* and generates test mode setting signal MODE in accordance with internal test address signal bit ADi received from test mode register circuit 1*bb*. In the test mode, internal test address signal bit ADi is deactivated or deasserted, and test mode register circuit 1*bb* is initialized to the state for deactivating test mode setting signal MODE. Now, operation of the test mode setting circuit shown in FIG. 2A will be described with reference to a signal waveform diagram shown in FIG. 2B.

When external signal EX is set to a super VIH which is a voltage level higher than the H-level of voltage applied in a normal mode, test mode activating circuit 1*ba* determines that the test mode is designated, and activates test mode address defining signal TMSA. Upon elapsing of a predetermined time period, test mode activating circuit 1*ba* activates test address setting signal TDS in a one-shot pulse form for application to test mode register circuit 1*bb*. In accordance with test address setting signal TDS, test mode register circuit 1*bb* takes in and latches externally applied test address signal bit TADD for setting internal test address signal bit ADi to the state corresponding to the state of externally applied test address signal bit TADD.

Since internal test address signal bit ADi is initially inactive, test mode setting signal generating circuit 1*c* maintains test mode setting signal MODE inactive even when test mode address defining signal TMSA is activated. When internal test address signal bit ADi is set to a predetermined state in accordance with externally applied test address signal bit TADD, test mode setting signal generating circuit 1*c* drives test mode setting signal MODE to the active state.

Figure 2B:
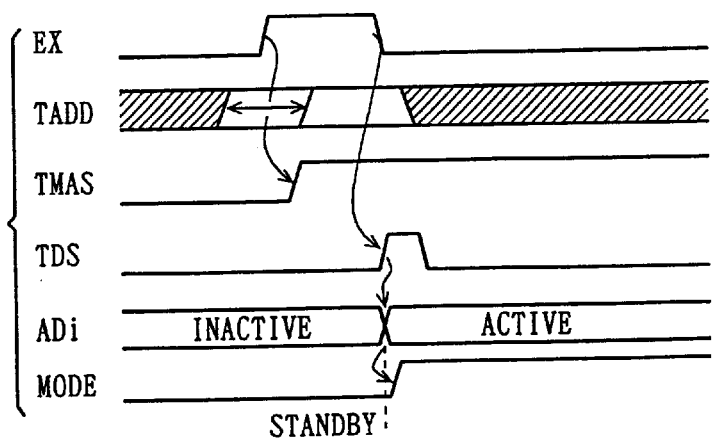

Accordingly, even if external signal EX and test address signal bit TADD are made defined at different timings, mode setting signal MODE for setting an intended test mode can be activated accurately as shown in FIG. 2B, and activation of an erroneous test mode setting signal can be prevented.

Test address signal bit TADD is a signal applied to the address input pad, and is an address signal bit applied to an address input buffer included in an internal circuit (not shown).

Figure 3:
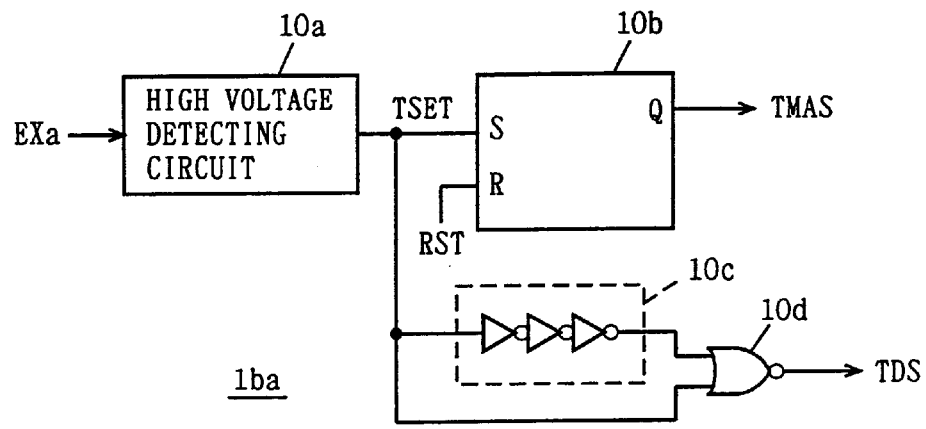
FIG. 3 schematically shows an exemplary structure of a test mode activating circuit shown in FIG. 2A.

FIG. 3 schematically shows a structure of test mode activating circuit 1*ba* shown in FIG. 2A. In FIG. 3, test mode activating circuit 1*ba* includes a high voltage detecting circuit 10*a* for detecting that a specific external signal EXa satisfies the super VIH condition, a set/reset flip-flop 10*b* which is set when an output signal TEST of high voltage detecting circuit 10*a* is activated and is reset when reset signal RST is activated, an inverting delay circuit 10*c* which inverts and delays by a predetermined time the output signal of high voltage detecting circuit 10*a,* and an NOR circuit 10*d* which receives the output signal of inverting delay circuit and output signal TEST of high voltage detecting circuit 10*a*. Set/reset flip-flop 10*b* generates test mode address defining signal TMAS from its output Q, and NOR circuit 10*d* generates test address setting signal TDS.

High voltage detecting circuit 10*a* generates the signal at H-level when externally applied specific signal EXa is set to the voltage condition of a voltage level higher than that in the normal mode. High voltage detecting circuit 10*a* is formed of a circuit with a plurality of diode-connected MOS transistors, for example. Set/reset flip-flop 10*b* drives signal TMAS from its output Q to the active state of H-level when output signal TEST of high voltage detecting circuit 10*a* rises to H-level. Inverting delay circuit 10*c* and NOR circuit 10*d* form a detecting circuit which generates a pulse of one shot in response to falling of the input signal, and drives its output signal TDS to the active state of H-level for a predetermined time period in response to falling of output signal TEST of high voltage detecting circuit 10*a*.

With the structure shown in FIG. 3, signals shown in FIG. 2B can be produced. In the structure shown in FIG. 3, high voltage detecting circuit 10*a* may include a structure of a one-shot pulse generating circuit which generates a pulse signal of one shot when specific external signal EXa is set to the super VIH condition. As an alternative to high voltage detecting circuit 10*a,* an ordinary circuit for detecting a WCBR (write enable, CAS before RAS) condition may be used, if the semiconductor device is a dynamic semiconductor memory device. Reset signal RST is driven to the active state when the test mode is completed or before start of the test mode.

Figure 4:
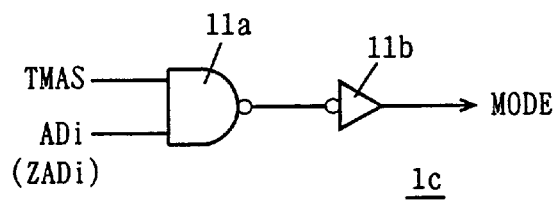
FIG. 4 shows an exemplary structure of a test mode setting signal generating lit shown in FIG. 2A.

FIG. 4 shows a structure of test mode setting signal generating circuit 1*c* shown in FIG. 2A. In FIG. 4, test mode setting signal generating circuit 1c includes an NAND circuit 11*a* which receives test mode address defining signal TMAS from test mode activating circuit 1*ba* and internal address signal bit ADi (or ZADi), and an inverter 11*b* inverting the output signal of NAND circuit 11*a*. Inverter 11*b* generates mode setting signal MODE activating a designated test mode. The value (logical level) of internal address signal bit ADi (or ZADi) applied to NAND circuit 11*a* depends on the test mode. In the standby state (initialized state), the output signal of test mode register circuit 1*bb* shown in FIG. 2A is set to a logical level for placing mode setting signal MODE in the inactive state.

Figure 5:
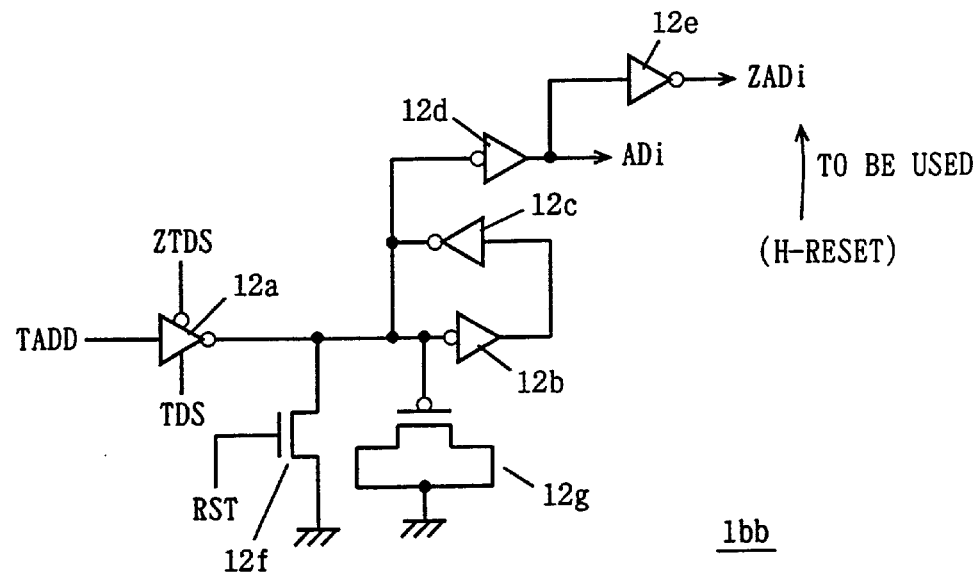
FIG. 5 shows a structure of a test mode register circuit shown in FIG. 2A.

FIG. 5 shows a structure of a test mode register included in test mode circuit 1*bb* shown in FIG. 2A. In FIG. 5, the test mode register includes a tristate inverter buffer 12*a* which is enabled to invert and transmit externally applied address signal bit TADD when test mode address setting signals TDS and ZTDS are active, an inverter 12*b* which inverts the output signal of tristate inverter buffer 12*a,* an inverter 12*c* which inverts the output signal of inverter 12*b* for transmission to the input of inverter 12*b,* an inverter 12*d* which inverts the output signal of inverter 12*c* to produce internal test address signal bit ADi, and an inverter 12*e* which inverts the output signal of inverter 12*d* to produce complemental internal test address signal bit ZADi. Inverters 12*b* and 12*c* form a latch circuit.

This test mode register further includes an n-channel MOS transistor 12*f* which is turned on in response to reset signal RST to discharge the input of inverter 12*b* to the ground potential level, and a stabilizing capacitance 12*g* which is formed of a p-channel MOS transistor for stabilizing the voltage on the input of inverter 12*b*. For the following reason, the p-channel MOS transistor is used as stabilizing capacitance 12*g*. In the initialized state, the input of inverter 12*b* attains L-level so that the channel of the transistor is formed and the capacitance is stably formed. The MOS transistor is off and does not form a PMOS capacitor when it receives a signal at H-level from tristate inverter buffer 12*a*. Accordingly, the voltage on the input of inverter 12*b* can be changed rapidly owing to the employment of the p-channel MOS transistor.

In the structure of the test mode register shown in FIG. 5, true internal test address signal bit ADi is set to H-level in the initialized state. This state will be referred to as an "H-reset state" hereinafter. The test mode may be activated when test address signal bit ADi is set to L-level, in which case the true address signal bit ADi is used. Alternatively, the test mode may be activated when corresponding test mode address TADD is set to L-level. In this case, complemental test address signal bit ZADi is used. Thereby, erroneous setting of the mode setting signal can be reliably prevented in the initialized state (standby state).

Figure 6:
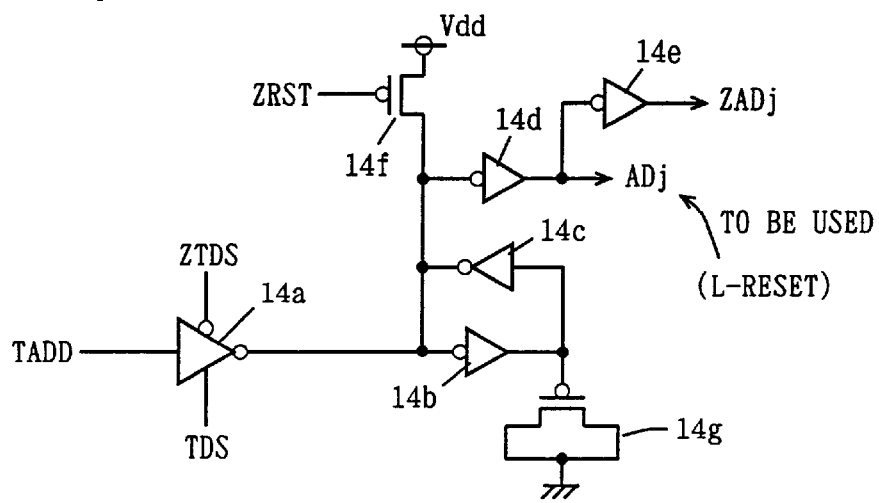
FIG. 6 shows another structure of the test mode register circuit shown in FIG. 2A.

FIG. 6 shows another structure of the test mode register included in the test mode register circuit shown in FIG. 2A. In FIG. 6, the test mode register includes a tristate inverter buffer 14a enabled in response to activation of test mode address setting signals TDS and ZTDS, for inverting externally applied test mode address signal bit TADD, an inverter 14b inverting the output signal of tristate inverter buffer 14a, an inverter 14c inverting the output signal of inverter 14b for application to the input of inverter 14b, an inverter 14d inverting the signal on the input of inverter 14b to produces a true internal test address signal bit ADj, and an inverter 14e inverting the output signal of inverter 14d to produces a complemental internal test address signal bit ZADj. Inverters 14b and 14c form the latch circuit.

This test mode register further includes a p-channel MOS transistor 14f turned on to set the input of inverter 14b to the level of power supply voltage Vdd when reset signal ZRST is active, and a stabilizing capacitance 14g formed of a p-channel MOS transistor and arranged at the output of inverter 14b. In the test mode register shown in FIG. 6, the input of inverter 14b is initialized to H-level by MOS transistor 14f, and true internal test address signal bit ADj is set to and held at L-level when test mode address setting signal TDS is inactive. Complemental internal test address signal bit ZADj is held at H-level. The state in which true address signal bit ADj is reset to L-level during standby will be referred to as an "L-reset state" hereinafter.

When true address signal bit ADj is set to H-level in the above structure, the true internal test address signal bit is applied to the test mode setting circuit setting an operation to a corresponding test mode.

Figure 7A:
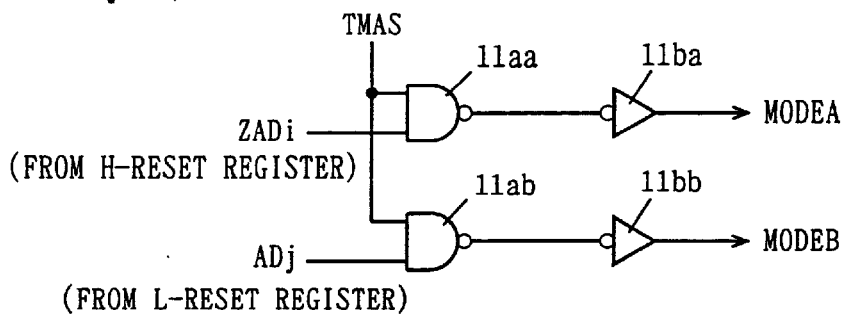
FIG. 7A shows another structure of the test mode setting signal generating circuit shown in FIG. 2A.
Figure 7B:
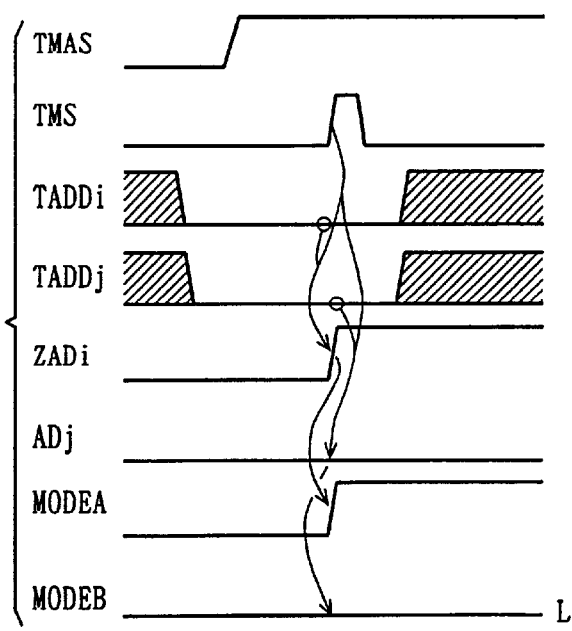
FIG. 7B shows operation waveforms of a test mode setting circuit shown in FIG. 7A.

Referring to FIG. 7A, the test mode setting signal generating circuit includes an NAND circuit 11aa receiving test mode address defining signal TMAS and test address signal bit ZADi, NAND circuit 11ab receiving test mode address defining signal TMAS and test address signal bit ADj, an inverter 11ba receiving the output signal of NAND circuit 11a, to generate a test mode setting signal MODEA, and an inverter 11bb receiving the output signal of NAND circuit 11ab, to generate a test mode setting signal MODEB. Test address signal bit ZADi is applied from the H-reset register shown in FIG. 5, and test address signal bit ADj is applied from the L-reset register shown in FIG. 6. Then, the operation of the test mode setting signal generating circuit shown in FIG. 7A will be described below with reference to a signal waveform diagram of FIG. 7B.

When test mode address defining signal TMAS attains H-level, NAND circuits 11aa and 11ab are enabled. In this state, externally applied test address signal bits TADDi and TADDj are set to predetermined states (L-level), respectively. However, test mode address setting signal TMS is still inactive at L-level, and the corresponding mode register still maintains the initial state (standby state) so that internal test address signal bit ZADi maintains L-level, and test address signal bit ADj maintains L-level. Therefore, even if test mode address defining signal TMAS is asserted in this state, both test mode setting signals MODEA and MODEB are inactive at L-level.

When test mode setting signal TMS is in the active state of H-level for a predetermined time period, internal test address signal bits ADj and ZADi are set to the states corresponding to externally applied test address signal bits TADDj and TADDi, respectively. Since externally applied test mode address signal bits TADDi and TADBj are both at L-level, complemental internal test address signal bit ZADi rises to H-level, and true internal test address signal bit ADj maintains L-level. Therefore, test mode setting signal MODEA attains H-level, and test mode setting signal MODEB maintains L-level.

As described above, the logical level of the initial state (standby state) of the mode register is set in accordance with the logic local of the activated state of an address signal bit used for setting the corresponding test mode, whereby an intended test mode can be accurately set even when the external signals vary in timing.

Figure 8:
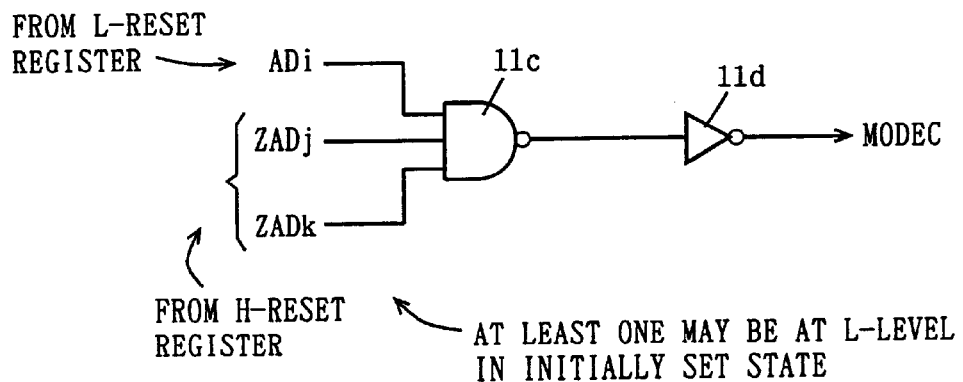
FIG. 8 shows still another embodiment of the test mode setting signal generating circuit shown in FIG. 2A.

FIG. 8 shows another structure of the test mode setting signal generating circuit. In FIG. 8, test mode setting signal generating circuit includes an NAND circuit 11c receiving test address signal bits ADj, ZADj and ZADk, and an inverter 11d receiving the output signal of NAND circuit 11c, to generate a test mode setting signal MODEC. Test address signal bit ADi is generated from the L-reset register shown in FIG. 6, and test address signal bits ZADj and ZADk are applied given from the H-reset register shown in FIG. 5. Test mode setting signal MODEC is activated when all test address signal bits ADi, ZADj and ZADk are set to H-level. In the initialized state (standby state), test address signal bits ADi, ZADj and ZADk are set to L-level. Therefore, the initialized state is different from the state in which test mode setting signal MODEC is activated, and erroneous activation of test mode setting signal MODEC can be prevented, as can also be done in the foregoing embodiment.

In the structure shown in FIG. 8, test address signal bits ADi, ZADJ and ZADk are all set to L-level. However, at least one bit of test address signal bits ADi, ZADj and ZADk may be reset to L-level in the initialized state (standby state). For example, test mode address signal bits ADi may be initialized to L-level, and test mode address signal bits ZADj and ZADk may be initialized to H-level. Test address signal bits ADi, ZADj and ZADk are only required to be in the states of which combination is different from that of the signal states activating test mode setting signal MODEC.

In this structure, it is not required to provide the H-reset register and L-reset register for each test address signal bit for all the test mode setting signals. Therefore, the mode registers can be small in number, and the area occupied by the circuit can be reduced.

Figure 9:
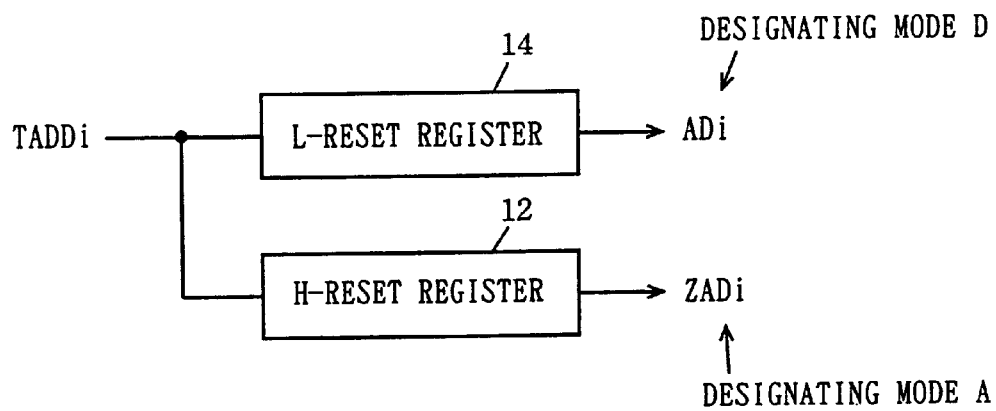
FIG. 9 shows another structure of the test mode register circuit shown in FIG. 2A.

FIG. 9 shows another structure of test mode register circuit 1bb. In FIG. 9, L-reset register 14 and H-reset register 12 are provided for test address signal bit TADDi. Internal test address signal bit ADi from L-reset register 14 is used for designating a test mode D. Complemental internal test address signal bit ZADi from H-reset register is used for designating a test mode A.

As shown in FIG. 9, L-reset register 14 and H-reset register 12 are provided for one test mode address signal bit TADDi, and test address signal bits ADi and ZADi therefrom are used, whereby one address signal bit can be used for two test modes (A and D), and the test mode can be accurately designated, as can also be done in the foregoing case.

Figure 10:
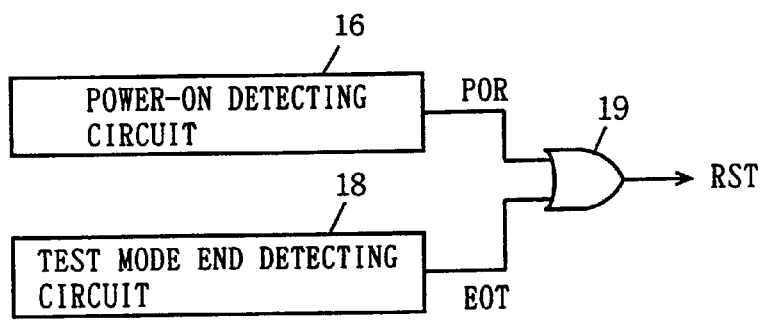
FIG. 10 schematically shows a structure of a circuit generating a reset signal shown FIGS. 3, 5 and 6.

FIG. 10 schematically shows a structure of the reset signal generating portion. In FIG. 10, the reset signal generating portion includes a power-on detecting circuit 16 for generating a pulse signal of one-shot when the power supply voltage becomes stable after power-on, a test mode end detecting circuit 18 detecting whether a signal representing the end of a test mode is applied or not, and an OR circuit 19 receiving an output signal POR of power-on detecting circuit 16 and an output signal EOT of test mode end detecting circuit 18. OR circuit 19 generates reset signal RST. Power-on detecting circuit 16 stops the operation of the internal circuitry until the power supply voltage becomes stable after power-on, and generates a power-on reset signal POR for resetting at the time of power-on so that the respective nodes for the operation of the internal circuitry may be set to the initial states. In the case where the semiconductor device is, for example, a semiconductor memory device, test mode end detecting circuit 18 detects the CBR (CAS before RAS) condition, and generates a test mode end detection signal EOT of a one-shot pulse. Accordingly, upon power-on and the end of test mode, reset signal RST is set to the active state of H-level for a predetermined period, and mode register circuit 1bb is reset to the predetermined state (i.e., is initialized).

The reset signal generating portion of the structure shown in FIG. 10 may include a test mode entry detecting circuit so that the reset signal may be generated every entry into the test mode. In this case, the test mode entry detecting circuit may be configured to determine that the test mode entry is instructed when the WCBR condition is satisfied, to generate the reset signal, if the semiconductor device is a semiconductor memory device. Each mode register can be reliably set to the initial state.

The description has been given on the structure for designating the test mode. However, the mode register may be used for designating a specific operation mode of the semiconductor device.

According to the embodiment 1 of the invention, as described above, the initial states of the internal address signal bits used for setting an operation mode are different from the activated states of internal address signal bits. Therefore, the timing conditions can be relaxed, and an intended operation mode can be accurately set.

[Embodiment 2]

Figure 11:
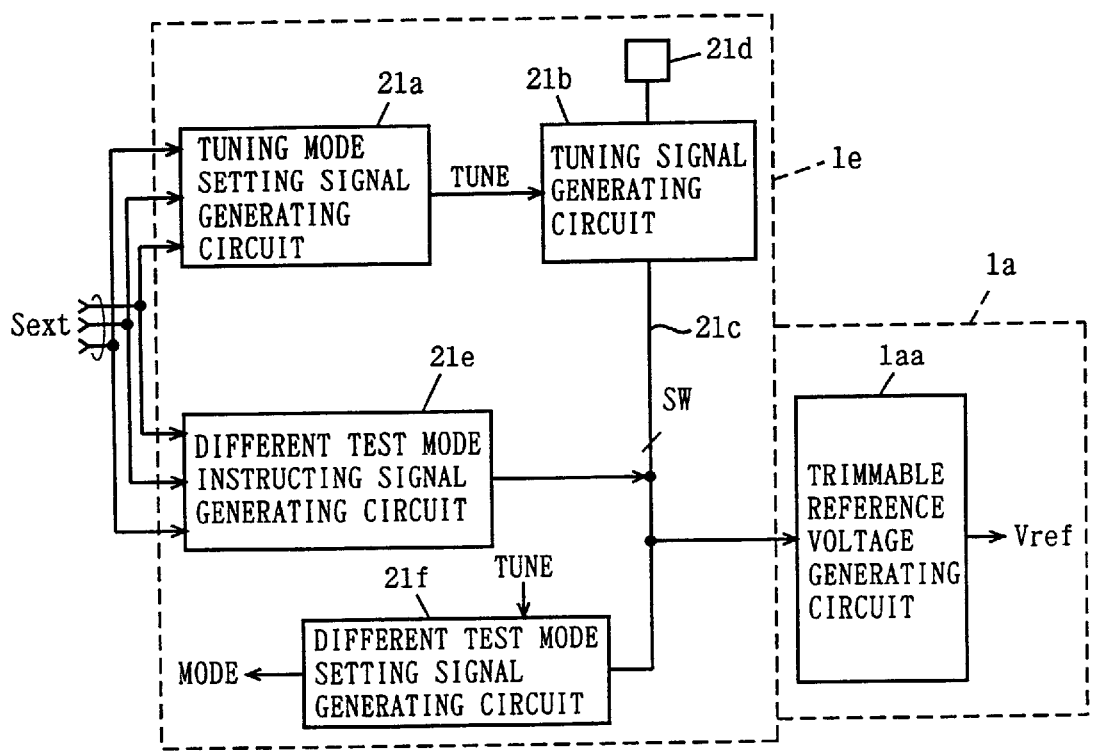
FIG. 11 schematically shows a structure of a main portion of a semiconductor device according to an embodiment 2 of the invention.

FIG. 11 schematically shows a structure of a main portion of a semiconductor device according to an embodiment 2 of the invention. In the semiconductor device shown in FIG. 11, internal circuit la includes a trimmable reference voltage circuit 1aa generating a reference voltage Vref. The voltage level of reference voltage Vref generated by trimmable reference voltage generating circuit 1aa can be adjusted by fuse elements, i.e. blowable link elements.

Test mode setting circuit 1e includes a tuning mode setting signal generating circuit 21a for generating a tuning mode setting signal TUNE representing designation of a tuning mode when external signal Sext is set to a predetermined state, a tuning signal generating circuit 21b enabled in response to activation of tuning mode setting signal TUNE from tuning mode setting signal generating circuit 21a, to take in the signal applied to a pad 21d for application onto an internal tuning signal line 21c as a tuning signal SW, a different test mode instructing signal generating circuit 21e which determines that a different test mode is instructed when external signal Sext is set to a predetermined state, to generate a the test mode instructing signal onto tuning signal line 21c, and a different test mode setting signal generating circuit 21f which generates a different test mode setting signal MODE for activating the different test mode in accordance with the signal applied onto tuning signal line 21c when tuning mode setting signal TUNE is inactive.

Different test mode instructing signal generating circuit 21e is set to the output high impedance state when it is not selected. Tuning signal SW from tuning signal generating circuit 21b is applied to a tuning element included in trimmable reference voltage generating circuit 1aa. Different test mode setting signal MODE generated from different test mode setting signal generating circuit 21f may designate any test mode operation.

Tuning mode setting signal generating circuit 21a and different test mode instructing signal generating circuit 21e may have the structures of the embodiment 1 or other structures, provided that the signal instructing the tuning mode or the different test mode is generated when external signal Sext is set to the predetermined state.

Tuning signal generating circuit 21b takes in the signal applied via pad 21d, and generates tuning signal SW, and the voltage level of reference voltage Vref generated by trimmable reference voltage generating circuit laa is controlled in accordance with tuning signal SW. The voltage level of reference voltage Vref is externally monitored while switching tuning signal SW among different states, whereby reference voltage Vref is set to the predetermined voltage level. The tuning test is a test at the wafer level. If the semiconductor device is a semiconductor memory device, this tuning test is performed before a redundant test made for redundant replacement of a defective memory cell. When a defective memory cell is replaced with a redundant memory cell, programming of fuse elements is performed based on the state of the tuning signal. After this, tuning signal line 21c is no longer used for the tuning test. A plurality of tuning signals are present, and one tuning signal line is provided for each tuning signal. Tuning signal lines 21c are also used as signal lines for setting the different test, whereby the signal lines for test are reduced in number, and an area occupied by interconnection lines is reduced.

Figure 12:
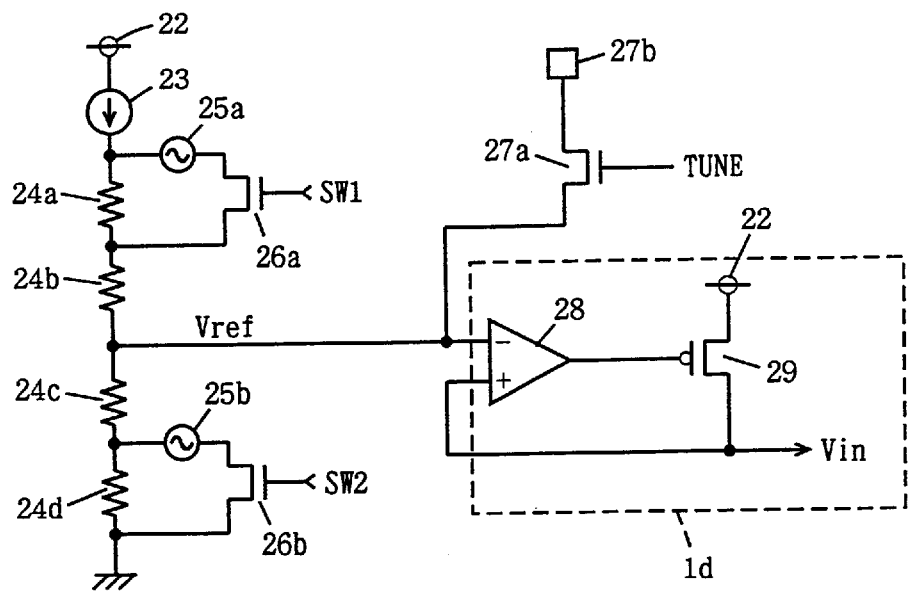
FIG. 12 shows an exemplary a structure of a trimmable reference voltage generating circuit shown in FIG. 11.

FIG. 12 shows an exemplary a structure of trimmable reference voltage generating circuit 1aa. FIG. 12 shows an arrangement for producing an internal operation power supply voltage in accordance with reference voltage Vref generated by trimmable reference voltage generating circuit 1aa.

In FIG. 12, trimmable reference voltage generating circuit 1aa includes a constant current source 23 coupled to an external power supply node 22, resistance elements 24a, 24b, 24c and 24d connected in series between constant current source 23 and the ground node, a fuse element 25a having one end connected to an end of resistance element 24a, a fuse element 25b having one end connected to an end of resistance element 24d, a switching transistor 26a turned on in response to a tuning signal SW1, to connect the other end of fuse element 25a to the other end of resistance element 24a, and a switching transistor 26b turned on in response to a tuning signal SW2, to connect the other end of fuse element 25b to the other end of resistance element 24d. Although FIG. 12 shows a reduced number of resistance elements for simplicity reason, the numbers of the resistance elements and fuse elements can be determined appropriately.

The resistance values of switching elements 26a and 26b in the on state are set to extremely small, ignorable values, as compared with the resistance values of resistance elements 24a–24d.

For externally monitoring reference voltage Vref, a switching element 27a is arranged, which is turned on to transmit reference voltage Vref to a pad 27b in response to tuning mode setting signal TUNE.

The internal power supply circuit 1d shown in FIG. 1 produces internal power supply voltage Vin based on reference voltage Vref. Internal power supply circuit 1d includes a comparator 28 for comparing reference voltage Vref with internal power supply voltage Vin, and a current decive transistor 29 formed of a p-channel MOS transistor and having a conductance controlled in response to the output signal of comparator 28, to supply a current from external power supply node 22 to an internal power supply node. Comparator 28 is formed of a differential amplifier, and has a positive input receiving internal power supply voltage Vin and a negative input receiving reference voltage Vref.

When reference voltage Vref is higher than internal power supply voltage Vin, the voltage level of output signal of comparator 28 lowers, and the conductance of current drive transistor 29 increases so that a current is supplied from external power supply node 22 to the internal power supply node, and the voltage level of internal power supply voltage Vin rises. Conversely, when internal power supply voltage Vin is higher than reference voltage Vref, the output signal of comparator 28 is at H-level, and current drive transistor 29 is off and to cut off the current path from external power supply node 22 to the internal power supply node. Therefore, internal power supply voltage Vin is set substantially to the voltage level of reference voltage Vref. The internal circuit uses internal power supply voltage Vin as one operation power supply voltage. For ensuring the operation characteristics of internal circuitry, the voltage level of internal power supply voltage Vin must be accurately set within a predetermined voltage range, and reference voltage Vref must be accurately set to the predetermined voltage level.

In the case where internal power supply voltage Vin produced in accordance with reference voltage Vref is applied to a sense amplifier power supply circuit to be described later, data at H-level of internal power supply voltage Vin is written into a memory cell. When the voltage level of reference voltage Vref is low, the voltage level of H-level written into the memory cell is low. Therefore, when a test is made for determining charge retention characteristics or the like of memory cells with reference voltage Vref lower than the predetermined level, a normal memory cell may be determined as a defective memory cell.

In the case where a substrate bias voltage is generated in accordance with internal power supply voltage Vin, if reference voltage Vref is low, the voltage level of internal power supply voltage Vin is also low so that a oscillating frequency of an oscillator included in a substrate bias voltage generating circuit is low, and the substrate voltage cannot be produced with a sufficiently large charge supply capability, resulting in a shallow substrate bias voltage (small in absolute value). In this case, a leak current from a memory cell to the substrate decreases. Conversely, when reference voltage Vref is set to a higher voltage level, the oscillating frequency of the oscillator rises so that the substrate bias becomes deep, and the leak current from the memory cell to the substrate increases. Therefore, the test for determining whether the memory cell is defective or not must be performed after performing trimming for setting reference voltage Vref to the predetermined voltage level.

When reference voltage Vref is trimmed with link (fuse) elements 25a and 25b, the operation of determining whether the memory cells are defective or not will be performed again. After this determining operation, the program operation for replacement of the defective memory cell(s) is performed and, in this programming operation, the fuse(s) must be blown off for programming a defective address. This increases the number of steps of blowing the fuses. A blown off fuse element cannot be restored to the initial state. For preventing increase in number of the fuse blowing steps and for accurately setting the voltage level of reference voltage Vref to the predetermined value, reference voltage Vref is measured, and the switching elements provided corresponding to the fuses to be blown off are turned off based on the measured data. For example, the test for determining whether a memory cell is defective or not is performed in this state. Thereafter, the fuse elements provided for the resistance elements are selectively blown off based on the trimming signal upon address programming of the defective memory cells, i.e., programming for replacement with the redundant memory cell(s). In this case, the fuse blowing steps can be reduced in number. Following operations are performed in the step of the tuning mode test for specifying a fuse element(s) to be blown off.

Tuning mode setting signal generating circuit 21a identifies a test mode in accordance with known timing conditions such as WCBR+address key condition, and more specifically determines whether the tuning mode is instructed or not. When the tuning mode is instructed, tuning mode setting signal generating circuit 21a drives tuning mode setting signal TUNE to the active state. Tuning mode setting signal generating circuit 21b takes in the signal applied from pad 21d in response to activation of tuning mode setting signal TUNE, and applies tuning signal SW onto tuning signal line 21c. Tuning signal SW applied onto tuning signal line 21c corresponds to tuning signal SW1 or SW2 shown in FIG. 12. A signal corresponding to each tuning signal is externally applied through the pads. When tuning mode setting signal TUNE is active, different test mode instructing signal generating circuit 21e is kept in the output high impedance state, and different test mode setting signal generating circuit 2 if is disabled (test mode setting signal MODE is kept inactive).

As shown in FIG. 12, reference voltage Vref is transmitted to specific pad 27b in accordance with tuning mode setting signal TUNE, and is externally measurable. In this tuning mode, it is determined through pad 27b whether reference voltage Vref is at the predetermined voltage level or not. When reference voltage Vref is at the voltage level different from the predetermined voltage level, which of a switching element between switching elements 26a and 26b is to be turned on or off for setting reference voltage Vref to the predetermined level, is determined. In accordance with the result of this determination, the tuning signal is applied again through pad 21d (FIG. 11). The voltage level of reference voltage Vref generated from trimmable reference voltage generating circuit 1aa is changed, and the voltage level of reference voltage Vref is measured again. The foregoing operations are repeated until reference voltage Vref reaches the intended voltage level.

In the above tuning test, tuning mode setting signal TUNE may be continuously maintained active during the tuning mode, and the signal for tuning may be applied through pad 21d. Also, such a structure may be employed that tuning mode setting signal TUNE is activated every time the tuning signal is applied. For example, tuning signal SW generated from tuning signal generating circuit 21b is latched by a latch circuit (not shown), and reference voltage Vref generated from trimmable reference voltage generating circuit 1aa is held at the intended voltage level during the redundant test. After the redundant test, programming of fuse elements 25a and 25bshown in FIG. 12 is performed. After the programming of fuse elements 25a and 25b, tuning signals SW1 and SW2 are fixed in the state of H-level.

In this tuning test, different test mode instructing signal generating circuit 21e is set to the output high impedance state because the test mode assigned thereto is different from the currently instructed test mode. Therefore, different test mode instruction signal generating circuit 21e exerts no influence on tuning signal SW transmitted onto tuning signal line 21c. Different test mode setting signal generating circuit 21f is disabled when tuning mode setting signal TUNE is active, and therefore the different test mode is not selected.

If the different test mode is not used for the redundant cell replacement, no problem arises even if tuning signal line 21c is commonly used. Tuning signals SW1 and SW2 shown in FIG. 12 must be held at H-level during the function test and the test at the chip level after the redundant test. In this case, it is necessary that the signal from different test mode instructing signal generating circuit 21e does not exert an influence on the tuning signal. Specific structures of the respective portions will be described below.

Figure 13:
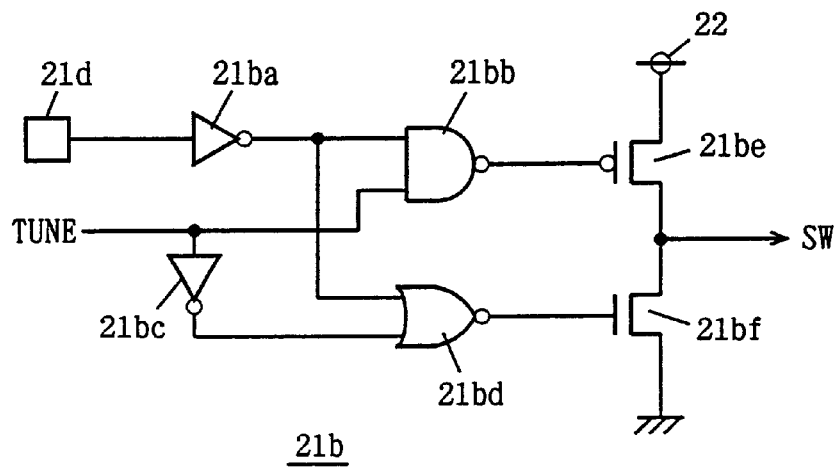
FIG. 13 shows a structure of a tuning mode setting signal generating circuit shown in FIG. 11.

FIG. 13 shows a structure of tuning signal generating circuit 21b shown in FIG. 11. In FIG. 13, tuning signal generating circuit 21b includes an inverter 21ba inverting a signal applied to pad 21d, an NAND circuit 21bb receiving tuning mode setting signal TUNE and the output signal of inverter 21ba, an inverter 21bc inverting tuning mode setting signal TUNE, an NOR circuit 21bd receiving the output signals of inverters 21ba and 21bc, a p-channel MOS transistor 21be turned on to drive tuning signal SW to H-level when the output signal of NAND circuit 21bb is at L-level, and an n-channel MOS transistor 21bf turned on to generate tuning signal SW at L-level when the output signal of NOR circuit 21bd is at H-level. In the structure shown in FIG. 13, p-channel MOS transistor 21be has a source connected to external power supply node 22. However, it may be connected to an internal power supply node.

When tuning mode setting signal TUNE is at L-level, the output signal of NAND circuit 21bb is at H-level, and p-channel MOS transistor 21be is off. Also, the output signal of NOR circuit 21bd is at L-level, and n-channel MOS transistor 21bf is off. In this state, tuning signal generating circuit 21b is set to the output high impedance state.

When tuning mode setting signal TUNE attains H-level, NAND circuit 21bb and NOR circuit 21bd operate as inverters, to drive tuning signal SW to H- or L-level in accordance with the signal applied to pad 21d.

Figure 14:
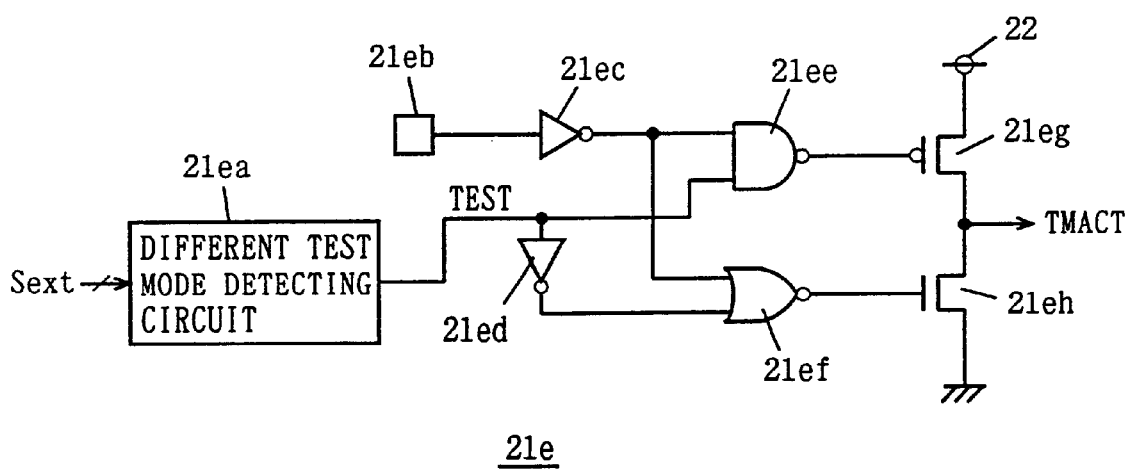
FIG. 14 shows a structure of a different test mode instructing signal generating circuit shown in FIG. 11.

FIG. 14 shows an example of the structure of different test mode instructing signal generating circuit 21e shown in FIG. 11. In FIG. 14, different test mode instructing signal generating circuit 21e includes a different test mode detecting circuit 21eb for which driving different test mode detection signal TEST to the active state when external signal Sext designates the different test mode, an inverter 21ec for inverting the signal applied to a pad 21ab, an inverter 21ed for inverting different test mode detection signal TEST received from different test mode detecting circuit 21ea, an NAND circuit 21ee receiving the output signal of inverter 21ec and different test mode detection signal TEST, an NOR circuit 21ef receiving the output signals of inverters 21ec and 21ed, a p-channel MOS transistor 21ed turned on to drive a different test mode activating signal TMACT to H-level when the output signal of NAND circuit 21ee is at L-level, and an n-channel MOS transistor 21eh turned on to drive different test mode activating signal TMACT to L-level when the output signal of NOR circuit 21ef is at H-level.

Different test mode detecting circuit 21ea determines whether the WCBR condition is satisfied or not, in accordance with external signal Sext, for example. Pad 21eb is supplied with, e.g., the address signal bit. When different test mode detection signal TEST from different test mode detecting circuit 21ea is in the inactive state of L-level, the output signal of NAND circuit 21ee is at H-level, and the output signal of NOR circuit 21ef is at L-level so that different test mode instructing signal generating circuit 21e attains the output high impedance state. When the different test mode is designated, different test mode detection signal TEST attains H-level, and NAND circuit 21ee and NOR circuit 21ef operate as inverters. In this state, when the signal applied to pad 21eb is at H-level, different test mode activating signal TMACT maintains the inactive state of L-level. When the signal applied to pad 21eb is at L-level, MOS transistor 21eg is turned on, and different test mode activating signal TMACT is driven to H-level.

In different test mode instructing signal generating circuit 21e shown in FIG. 14, different test mode detecting circuit 21ea detects, e.g., the WCBR condition or WCBR +super VIH condition, and also determines whether the different test mode is designated or not, in accordance with the logical value of the address signal bit applied from pad 21eb. Different test mode detecting circuit 21ea may have the same structure as that of the embodiment 1. In the structure in which the tuning mode is designated, different test mode detecting circuit 21ea is adapted to detect the different test mode based on the state of external signal Sext different from the state for designating the tuning mode, and enters the output high impedance state so that no conflict occurs between the signals even if tuning signal line 21c is commonly used.

Figure 15:
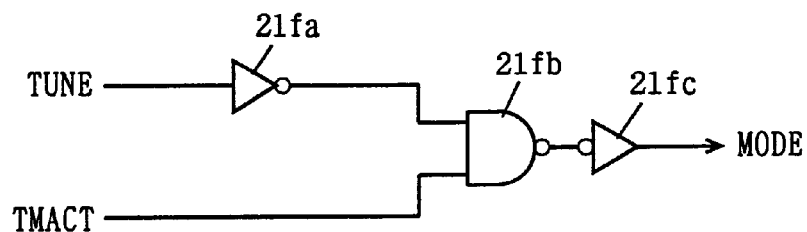
FIG. 15 shows a structure of a different test mode setting signal generating circuit shown in FIG. 11.

FIG. 15 shows a structure of different test mode setting signal generating circuit 21f shown in FIG. 11. In FIG. 15, different test mode setting signal generating circuit 21f includes an inverter 21fa receiving tuning mode setting signal TUNE, an NAND circuit 21fb receiving the output signal of inverter 21fa and different test mode activating signal TMACT, and an inverter 21fc inverting the output signal of NAND circuit 21fb to generate test mode setting signal MODE. In accordance with test mode setting signal MODE from inverter 21fc, the internal circuit is set to the state for executing a corresponding test operation.

When tuning mode setting signal TUNE is at H-level and the tuning mode is executed, the output signal of inverter 21fa is at L-level, and test mode setting signal MODE is held at L-level. When tuning mode setting signal TUNE is at L-level, the output of inverter 21fa is at H-level, and NAND circuit 21fb operates as an inverter. In this state, test mode setting signal MODE is activated/deactivated in accordance with the state of test mode activating signal TMACT.

Figure 16:
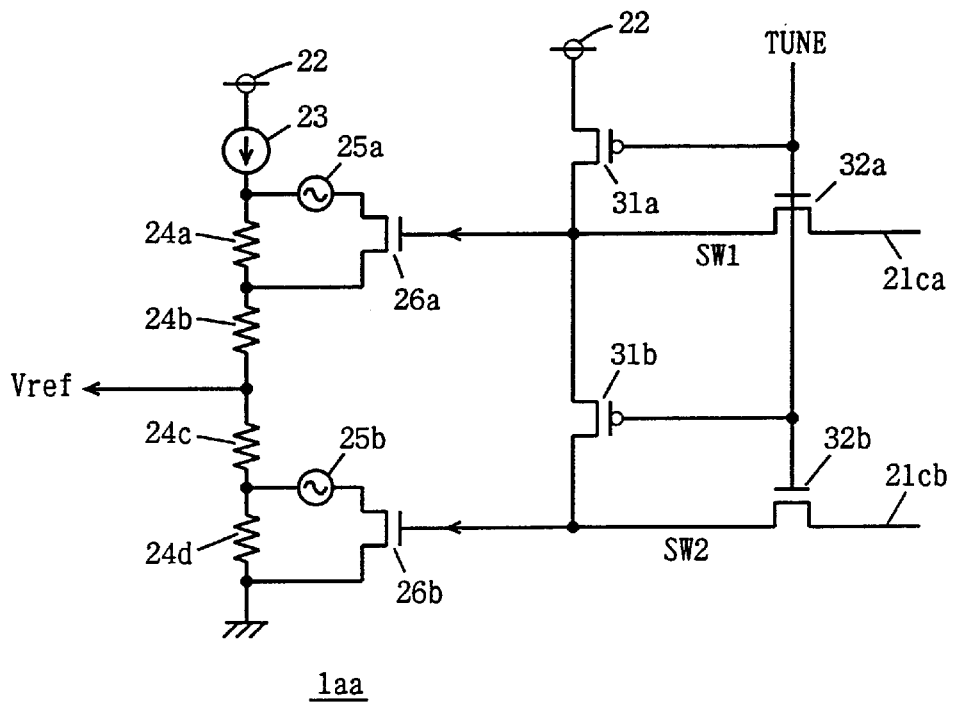
FIG. 16 shows a structure of the trimmable reference voltage generating circuit shown in FIG. 11.

FIG. 16 shows a specific structure of a portion of trimmable reference voltage generating circuit 1aa. In this trimmable reference voltage generating circuit shown in FIG. 16, tuning signal lines 21c (21ca and 21cb) are commonly used by another test mode activating circuit. For this common use, switching transistors 32a and 32b, which are turned off when tuning mode setting signal TUNE is inactive, are provided for tuning signal lines 21ca and 21cb, respectively. Further, there are arranged switching transistors 31a and 31b formed of p-channel MOS transistors and turned on when tuning mode setting signal TUNE is inactive, to couple the voltage applied from external power supply node 22 to tuning switching transistors 26a and 26b, respectively.

In the tuning mode, tuning mode setting signal TUNE attains the active state of H-level so that switching transistors 31a and 31b are turned off. Switching transistors 32a and 32b are turned on, and tuning switching transistors 26a and 26b are set to the on/off states in accordance with tuning signals SW1 and SW2 transmitted through tuning signal lines 21ca and 21cb, respectively.

When the tuning mode is completed, tuning mode setting signal TUNE attains L-level so that switching transistors 32a and 32b are turned off, and switching transistors 31a and 31b are turned on. Thereby, tuning switching transistors 26a and 26b receive the gate voltages at the level of external power supply node 22, and are continuously kept on. In the structure shown in FIG. 16, programming of fuse elements 25a and 25b is performed after completion of the tuning mode. During the test of the redundant circuit, the switching transistor connected to the unblown fuse element maintains the on state so that the reference voltage at the intended voltage level is accurately produced for performing the redundant test.

In the case where programming of fuse elements 25a and 25b is performed after completion of the tuning mode test, switching transistors 31a and 31b may be replaced with pull-up elements of high resistances.

Owing to provision of switching transistors 32a and 32b, the data signal at H-level is not transmitted onto tuning signal lines 21ca and 21cb even if tuning signal SW2 is held at H-level, when tuning mode setting signal TUNE is inactive. Therefore, activation of the different test mode can be prevented.

Figure 17:
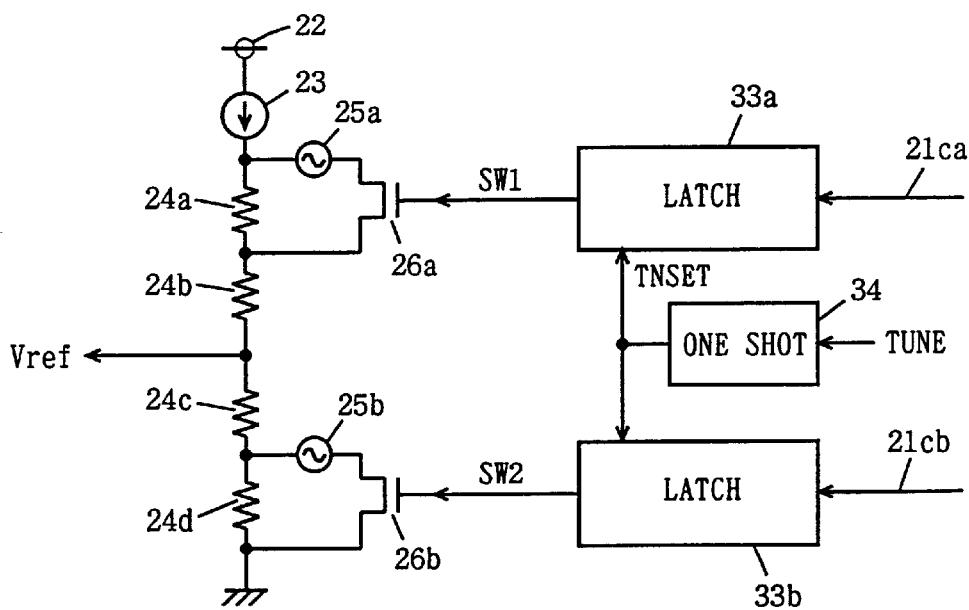
FIG. 17 shows another structure of the trimmable reference voltage generating circuit shown in FIG. 11.

FIG. 17 shows another structure of the trimmable reference voltage generating circuit. In the structure shown in FIG. 17, tuning switching transistors 26a and 26b have their respective gates coupled to latches 33a and 33b, which in turn take in and latch the signals transmitted onto tuning lines 21ca and 21cb in response to a tuning signal set instructing signal TNSET. The tuning signal set instructing signal TNSET is produced from a one-shot pulse generating circuit 34 responsive to tuning mode setting signal TUNE. When latches 33a and 33b are in the latching state, they are in the high input impedance state (i.e., the gates in the input stages thereof are off) so that the latched data does not affect tuning signal lines 21ca and 21cb. Therefore, if the test mode setting signal generating circuit connected to tuning signal lines 21ca and 21cb is in the output high impedance state, tuning signal lines 21ca and 21cb maintain the high impedance state when latches 33a and 33b are in the latching state. Therefore, the latched data of latches 33a and 33b does not adversely affect other test modes.

In the structure shown in FIG. 17, tuning switching transistors 26a and 26b can be turned on/off in accordance with the data latched by latches 33a and 33b, respectively. Therefore, reference voltage Vref can be produced in accordance with the latched data of latches 33a and 33b, and the redundant test can be performed. In this case, fuse elements 25a and 25b can be programmed in the same process as the programming of redundant cells.

When tuning mode setting signal TUNE is produced in the form of a one-shot pulse, it is not necessary to provide one-shot pulse generating circuit 34. Latches 33a and 33b are in the through state and take in the received tuning signal when tuning signal set instructing signal TNSET is at H-level. When instructing signal TNSET attains L-level, latches 33a and 33b attain the latching state, to isolate their input nodes from the output nodes.

Figure 18:
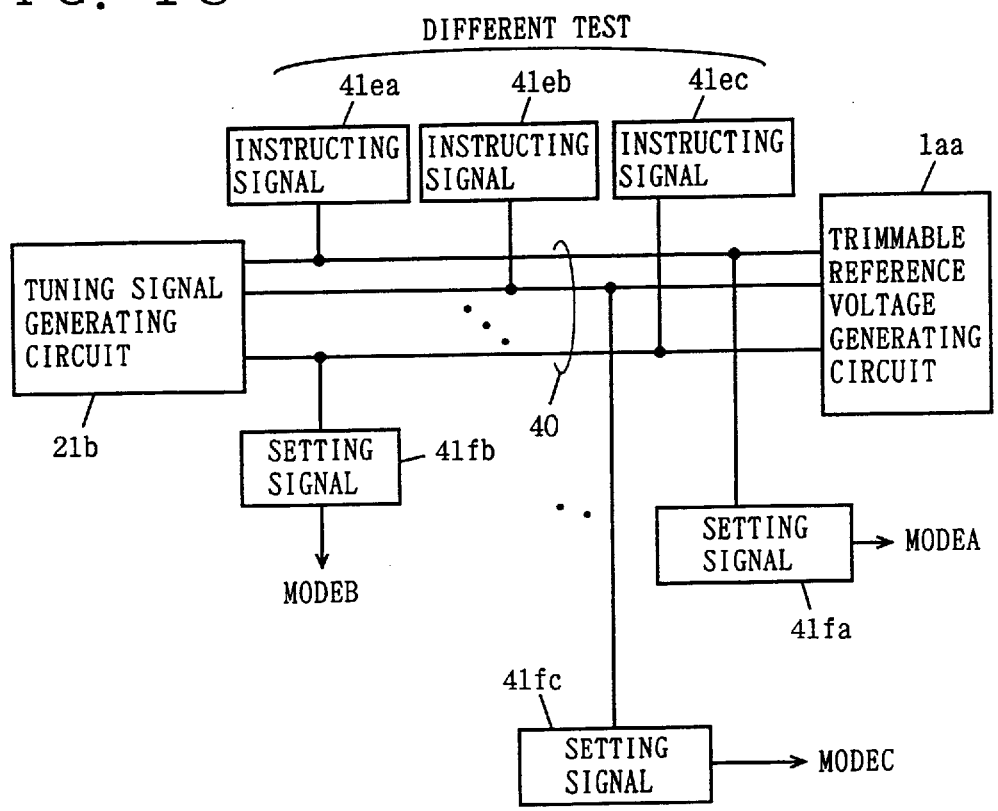
FIG. 18 schematically shows another structure of the semiconductor device according to the embodiment 2 of the invention.

FIG. 18 schematically shows a whole structure of the test mode setting circuit. In FIG. 18, the tuning signal generated from tuning signal generating circuit 21b is applied to trimmable reference voltage generating circuit 1aa through a tuning signal bus 40. Tuning signal bus 40 includes a plurality of signal lines. Different test mode instructing signal generating circuits 41ea, 41eb and 41ec are connected to the signal lines of tuning signal bus 40, respectively. Different test mode instructing signal generating circuits 41ea–41ec are set to the output high impedance state when they are inactive. For tuning signal bus 40, there are arranged test mode setting signal generating circuits 41fa, 41fb and 41fc activated to generate corresponding test mode setting signals MODEA, MODEB and MODEC respectively when corresponding test mode instructing signals are active (tuning mode setting signal is inactive).

In the structure shown in FIG. 18, it is not necessary to provide signal lines corresponding to the respective test modes, and an area occupied by the interconnection lines is significantly reduced. In accordance with the interconnection layout of tuning signal bus 40, the test mode instructing signal generating circuits and the corresponding test mode setting signal generating circuits can be arranged at appropriate positions so that a degree of freedom of layout is increased.

[Embodiment 3]

Figure 19:
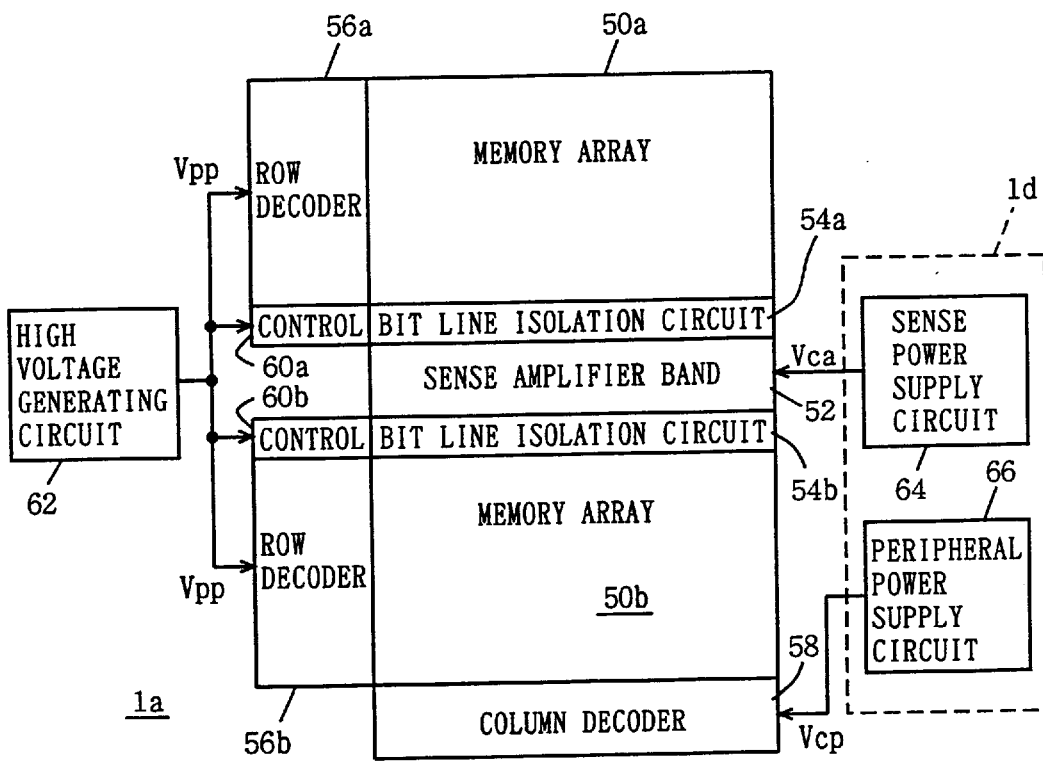
FIG. 19 schematically shows a whole structure of a semiconductor device according to an embodiment 3 of the invention.

FIG. 19 schematically shows a structure of a main portion of a semiconductor device according to an embodiment 3 of the invention. In FIG. 19, the semiconductor device is a semiconductor memory device, in which internal circuit 1a includes a plurality of memory cells. More specifically, internal circuit 1a includes memory arrays 50a and 50b each including a plurality of dynamic memory cells arranged in rows and columns, a sense amplifier band 52 arranged between memory cell arrays 50a and 50b and including a. plurality of sense amplifiers provided corresponding to the columns of memory arrays 50a and 50b, respectively, for sensing and amplifying data in each column of the memory array including a selected memory cell when activated, a bit line isolating circuit 54a arranged between the respective columns of memory array 50a and the corresponding sense amplifiers included in sense amplifier band 52 for isolating the columns of memory array 50a from the sense amplifiers included in sense amplifier band 52 under the control of a control circuit 60a, and a bit line isolating circuit 54b arranged between sense amplifier band 52 and memory array 50b for isolating memory array 50b from sense amplifier band 52 under the control of a control circuit 60b.

Control circuit 60a maintains bit line isolating circuit 54a in the inactive state for connecting memory array 50a to sense amplifier band 52 when memory array 50a includes a selected memory cell. When a selected memory cell is included in memory array 50b, control circuit 60a activates bit line isolating circuit 54a, to isolate memory array 50a from sense amplifier band 52.

Control circuit 60b activates bit line isolating circuit 54b to isolate sense amplifier band 52 from memory array 50b when the selected memory cell is included in memory array 50a. When the selected memory cell is included in memory array 50b, control circuit 60b deactivates bit line isolating circuit 54b to connect sense amplifier band 52 to memory array 52b. During standby, control circuits 60a and 60b maintain bit line isolating circuits 54a and 54b in the inactive state so that sense amplifier band 52 is connected to both memory arrays 50a and 50b.

Internal circuit 1a includes a row decoder 56a provided for memory array 50a to drive an addressed row to the selected state, a row decoder 56b provided for memory array 50b to drive the addressed row in memory array 50b to the selected state, and a high voltage generating circuit 62 for applying a high voltage Vpp, which is to be transmitted onto a selected row (a word line), to row decoders 56a and 56b. Since high voltage Vpp is transmitted to a selected row, it is possible to prevent loss of written voltage (stored data at H-level) which may be caused by a threshold voltage of an access transistor in a dynamic memory cell to be described later.

Internal power supply circuit 1d includes a sense power supply circuit 64 for producing one operation power supply voltage Vca for each sense amplifier included in sense amplifier band 52, and a peripheral power supply circuit 66 for producing one operation power supply voltage Vcp for peripheral circuits such as row decoders 56, column decoder 58 and a control circuit (not shown). Sense power supply circuit 64 and peripheral power supply circuit 66, of which structures will be described later, produce internal voltages Vca and Vcp by lowering the externally applied power supply voltage, respectively.

Figure 20:
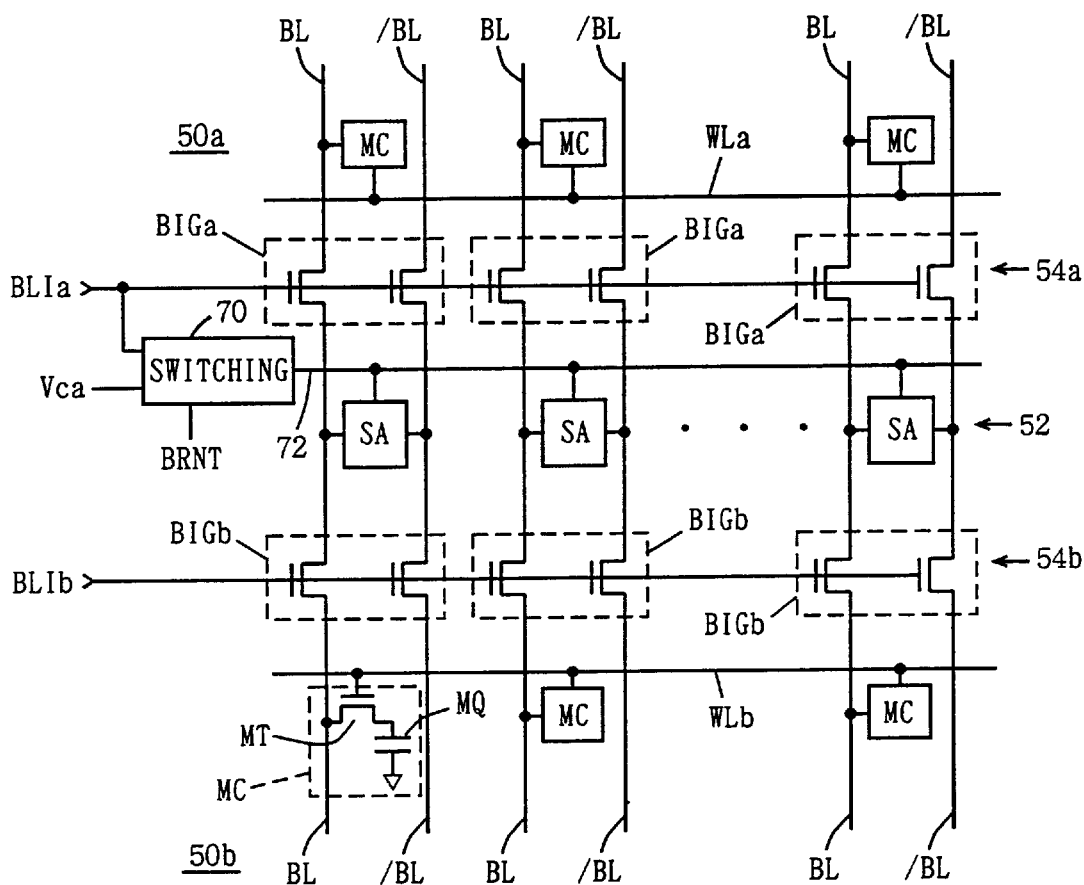
FIG. 20 schematically shows a structure of a main portion of the semiconductor device shown in FIG. 19.

FIG. 20 shows more specific structures of bit line isolating circuits 54a and 54b as well as sense amplifier band 52 shown in FIG. 19. In FIG. 20, memory cells MC in memory array 50a are arranged in rows and columns, and memory cells MC in memory array 50b are arranged in rows and columns. In memory array 50a, word lines WL are arranged corresponding to the rows of memory cells MC, respectively, and bit line pairs BL and /BL are arranged corresponding to the columns of memory cells MC, respectively. Bit line pairs BL and /BL are arranged corresponding to the columns of memory cells MC, respectively. In memory array 50b, bit line pairs BL and /BL are arranged corresponding to the columns of memory cells, respectively, and word lines WL are arranged corresponding to the columns of memory cells, respectively. FIG. 20 representatively shows word lines WLa and WLb, arranged in memory arrays 50a and 50b, respectively, and each corresponding to the memory cells in one row.

Memory cell MC includes a memory capacitor MQ for storing information, and an access transistor MT formed of an n-channel MOS transistor and connecting memory capacitor MQ to corresponding bit line BL (or /BL) in response to the signal potential on corresponding word line WL (WLa, WLb).

Bit line isolating circuit 54a includes bit line isolating gates BIGa provided corresponding to bit line pairs BL and /BL in memory array 50a, respectively, and selectively turned on in response to a bit line isolation instructing signal BLIa from control circuit 60a shown in FIG. 19. Bit line isolating circuit 54b includes bit line isolating gates BIGb provided corresponding to bit line pairs BL and /BL in memory array 50b, respectively, and selectively turned on in response to a bit line isolation instructing signal BLIb from control circuit 60b shown in FIG. 19. These bit line isolation instructing signals BLIa and BLIb are at the level of high voltage Vpp when they are inactive.

Sense amplifier band 52 includes sense amplifiers SA arranged corresponding to the columns (bit line pairs) in memory arrays 50a and 50b, respectively. A sense power supply line 72 is arranged commonly to these sense amplifiers SA. Using the power supply voltage on sense power supply line 72 as one operation power supply voltage, sense amplifier SA performs the differential amplification. Sense power supply line 72 is provided with a switch circuit 70, for transmitting one of bit line isolation instructing signal BLIa and sense power supply voltage Vca to sense power supply line 72 in response to an accelerated mode instructing signal BRNT. In the accelerated mode, the operation power supply voltage of the semiconductor device is raised from that in the normal operation mode, and each circuit operates based on the raised voltage.

The accelerated mode test is, e.g., a burn-in mode test, and will be merely referred to as a "burn-in test" hereinafter.

In the burn-in test mode, the internal voltage is raised for providing severe operation conditions, and the electric fields applied to gate insulating films and pn junctions are accelerated so that defects which were not detected in prior tests are revealed, and defective products are removed. Thereby, the reliability of outgoing products is improved.

In the burn-in test mode, switch circuit 70 selects and transmits bit line isolation instructing signal BLIa onto sense power supply line 72 in accordance with burn-in mode instructing signal BRNT. Bit line isolation instructing signal BLIa is at a level of high voltage Vpp. High voltage Vpp is produced by a charge pump operation, and the voltage level thereof depends on the level of the actually used power supply voltage. In the burn-in test mode, high voltage Vpp rises with the external power supply voltage. By applying a higher voltage to sense power supply line 72, voltage stress acceleration of sense amplifier SA can be efficiently performed (if the voltage level is low, the time for voltage application must be increased for applying a sufficient voltage stress).

Accordingly, the test time can be reduced, and the stress accelerated test can be efficiently performed.

Figure 21:
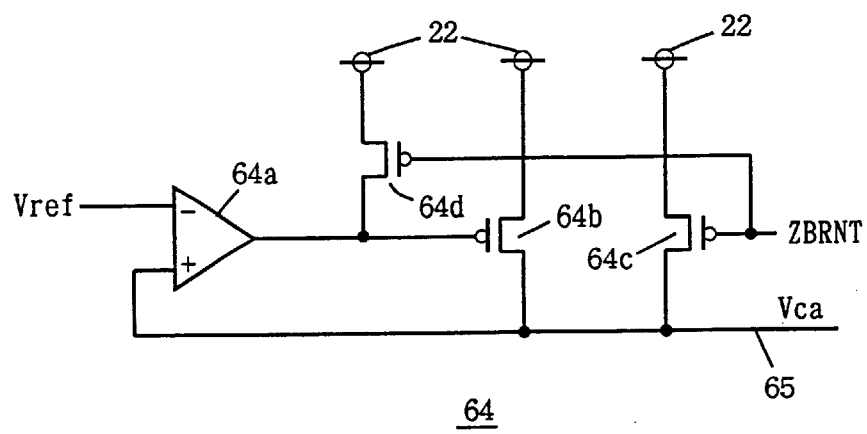
FIG. 21 shows an exemplary a structure of a sense power supply circuit shown in FIG. 19.

FIG. 21 shows a structure of sense power supply circuit 64 shown in FIG. 19. In FIG. 21, sense power supply circuit 64 includes a differential amplifier 64a for differentially amplifying sense power supply voltage Vca on internal power supply line 65 and reference voltage Vref, a current drive transistor 64b formed of a p-channel MOS transistor and supplying a current to internal power supply line 65 from external power supply node 22 in accordance with the output signal of differential amplifier 64a, a p-channel MOS transistor 64c turned on to connect electrically external power supply node 22 to internal power supply line 65 when burn-in mode instructing signal ZBRNT is active (at L-level), and a p-channel MOS transistor 64d turned on to connect electrically external power supply node 22 to the output node of differential amplifier 64a when burn-in mode instruction (setting) signal ZBRNT is active.

In the normal operation mode, burn-in mode instructing signal ZBRNT is at H-level, and MOS transistors 64c and 64d are off. In this state, differential amplifier 64a comparing sense power supply voltage Vca with reference voltage Vref controls a conductance of current drive transistor 64b in accordance with the result of comparison, and a current is supplied from external power supply node 22 to internal power supply line 65. Therefore, sense power supply voltage Vca attains the voltage level of reference voltage Vref.

When burn-in mode instructing signal ZBRNT is activated, MOS transistors 64c and 64d are turned on, and sense power supply voltage Vca attains the level of external power supply voltage applied to external power supply node 22. At the same time, the output node of differential amplifier 64a attains the level of external power supply voltage applied to external power supply node 22, and current drive transistor 64b maintains the off state. In this state, sense power supply voltage Vca is at the level of external power supply voltage, and the voltage level of external power supply voltage is raised during the burn-in test mode for performing the voltage stress acceleration of internal circuitry. Sense power supply voltage Vca is used for producing a precharge voltage applied to a bit line equalize/precharge circuit (not shown) and others.

It is considered that, in the burn-in mode, switch circuit 70 shown in FIG. 20 is not used, and sense power supply voltage Vca is used as one operation power supply voltage of sense amplifier SA. In this case, bit lines BL and /BL are driven to the external power supply voltage level. At the same time, word line WL (WLa, WLb) is driven to the selected state, and access transistor MT is turned on. For the voltage conditions for the voltage stress acceleration, it is required to prevent breakdown of the gate insulating film of access transistor MT. Therefore, the level of voltage applied to word line WL (Wa, Wb) cannot be increased so that the upper limit of sense power supply voltage Vca in the burn-in mode is determined by the level of voltage which can be transmitted to word line WL (WLa, WLb). Accordingly, the test time must be increased for sufficiently performing the voltage stress acceleration for sense amplifier SA. However, by transmitting bit line isolation instructing signal BLIa at the level of high voltage Vpp instead of sense power supply voltage Vca, the voltage stress acceleration of bit lines BL and /BL as well as the internal node of sense amplifier SA can be further enhanced, and the voltage stress can be further accelerated so that the voltage stress acceleration can be performed efficiently.

Figure 22:
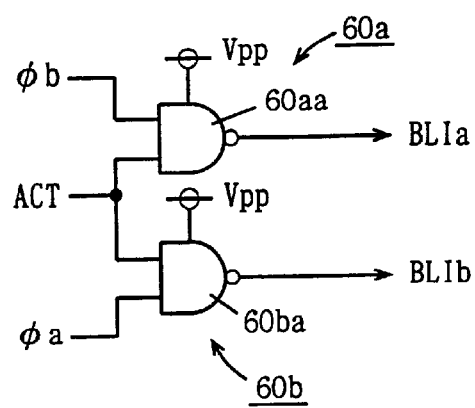
FIG. 22 shows an exemplary a structure of a control circuit shown in FIG. 19.

FIG. 22 shows structures of control circuits 60a and 60b shown in FIG. 19. In FIG. 22, control circuit 60a includes an NAND circuit 60aa receiving an array activating signal ACT and an array designating signal φb. Control circuit 60b includes an NAND circuit 60ba receiving array activating signal ACT and an array designating signal φa. NAND circuit 60aa uses high voltage Vpp as one power supply voltage, and generates bit line isolation instructing signal BLIa at the level of high voltage Vpp. NAND circuit 60ba uses high voltage Vpp as one its operation voltage, and generates bit line isolation instructing signal BLIb at the level of high voltage Vpp.

Array designating signal φa is activated and driven to H-level when a selected memory cell is included in memory array 50a. Array designating signal φb is activated and driven to H-level when the selected memory cell is included in memory array 50b. Array activating signal ACT is held active at H-level while memory array 50a or 50b is active (word line is in the selected state). Array activating signal ACT corresponds to an internal row address strobe signal RAS in a standard DRAM (Dynamic Random Access Memory).

During standby, array activating signal ACT is at L-level, and both bit line isolation instructing signals BLIa and BLIb are at the level of high voltage Vpp. When a memory cell selecting operation is to be started, array activating signal ACT is first driven to H-level. Then, a row decoder (not shown) decodes a row address signal so that an array designating signal for the memory array including a selected memory cell is driven to H-level. When memory array 50a includes the selected memory cell, array designating signal φb maintains L-level so that bit line isolation instructing signal BLIa is at H-level of high voltage Vpp. Conversely, when array designating signal φa is at H-level, bit line isolation instructing signal BLIb from NAND circuit 60ba is at L-level of the ground voltage, and all bit line isolation gates BIGb are off so that sense amplifier band 52 is isolated from memory array 50b.

The purpose of driving bit line isolation instructing signals BLIa and BLIb to the level of high voltage Vpp is to ensure reliable transmission of data at the level of array power supply voltage Vca to one of bit lines BL and /BL during the sensing operation of sense amplifier SA (for avoiding an influence which may be exerted on the written data at H-level by threshold voltage loss across the bit line isolation gate).

In the burn-in mode, the voltage levels of external and internal power supply voltages are raised. A high voltage generating circuit 62 is usually formed of a charge pump circuit using a capacitor. In the case where the charge pump circuit is used, the voltage level of produced high voltage Vpp depends on the circuit structure, but is usually given by a function (e.g., 2·Vcc–Vth) of operation power supply voltage Vcc and the threshohold voltage of the MOS transistor at the output stage. Accordingly, as the voltage level of power supply voltage Vcc rises, the voltage level of high voltage Vpp rises, and it is possible to accelerate the voltage stress even for the bit line isolation gate in the burn-in test mode. Since high voltage Vpp is transmitted onto a selected word line through the row decoder, the voltage stress acceleration of the selected word line and the access transistor is also performed.

In the burn-in test mode, a plurality of word lines in the selected memory array are simultaneously driven to the selected state. In this burn-in test mode, the word lines selected simultaneously are arbitrary in number.

Figure 23:
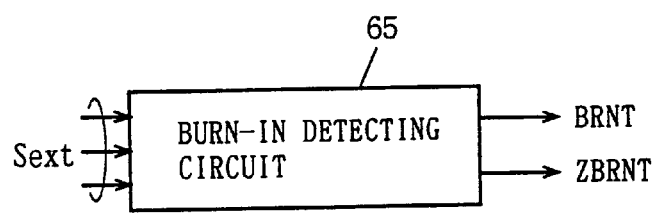
FIG. 23 schematically shows a structure of a burn-in mode instructing signal generating circuit.

FIG. 23 schematically shows a structure of a mode setting circuit for setting the burn-in test mode. In FIG. 23, the test mode setting circuit includes a burn-in detecting circuit 65 for identifying that the burn-in mode is designated, to generate burn-in mode instructing signals BRNT and ZBRNT when multi-bit external signal Sext is in the predetermined state. Burn-in detecting circuit 65 detects the designation of the burn-in test mode in accordance with the condition of WCBR +super VIH +address key, for example. Burn-in detecting circuit 65 may have a structure similar to that of the test mode setting circuit of the embodiment 1. Burn-in mode instructing signals BRNT and ZBRNT are complementary with each other.

Figure 24:
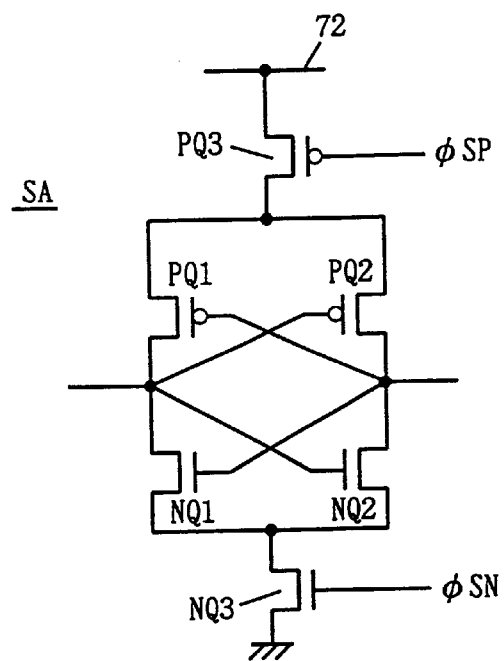
FIG. 24 shows a structure of a sense amplifier shown in FIG. 20.

FIG. 24 shows a structure of sense amplifier SA shown in FIG. 20. In FIG. 24, sense amplifier SA includes p-channel MOS transistors PQ1 and PQ2 having their gates and their drains cross-coupled, a p-channel MOS transistor PQ3 electrically connecting sense power supply line 72 to sources (sense drive nodes) of MOS transistors PQ1 and PQ2 in response to a sense amplifier activating signal φSP, n-channel MOS transistors NQ1 and NQ2 having their gates and their drains cross-coupled, and an n-channel MOS transistor NQ3 turned on to connect sources (sense drive nodes) of MOS transistors NQ1 and NQ2 to the ground line in response to activation of sense amplifier activating signal φSN.

Sense amplifier activating signal φSP is at L-level of the ground voltage when it is active. Sense amplifier activating signal φSN is at H-level when it is active, but is not required to be at the voltage level of high voltage Vpp because it is required only to discharge the node at a lower potential to the ground voltage level.

According to the structure of sense amplifier SA shown in FIG. 20, high voltage Vpp is transmitted onto sense power supply line 72 during the burn-in test mode, and MOS transistor PQ3 and one of MOS transistors PQ1 and PQ2 transmit high voltage Vpp to the corresponding bit line through the sense node.

Owing to the above, the voltage stress acceleration of bit lines BL and /BL as well as the transistors included in sense amplifier SA can be performed efficiently by transmitting high voltage Vpp to sense power supply line 72.

Figure 25:
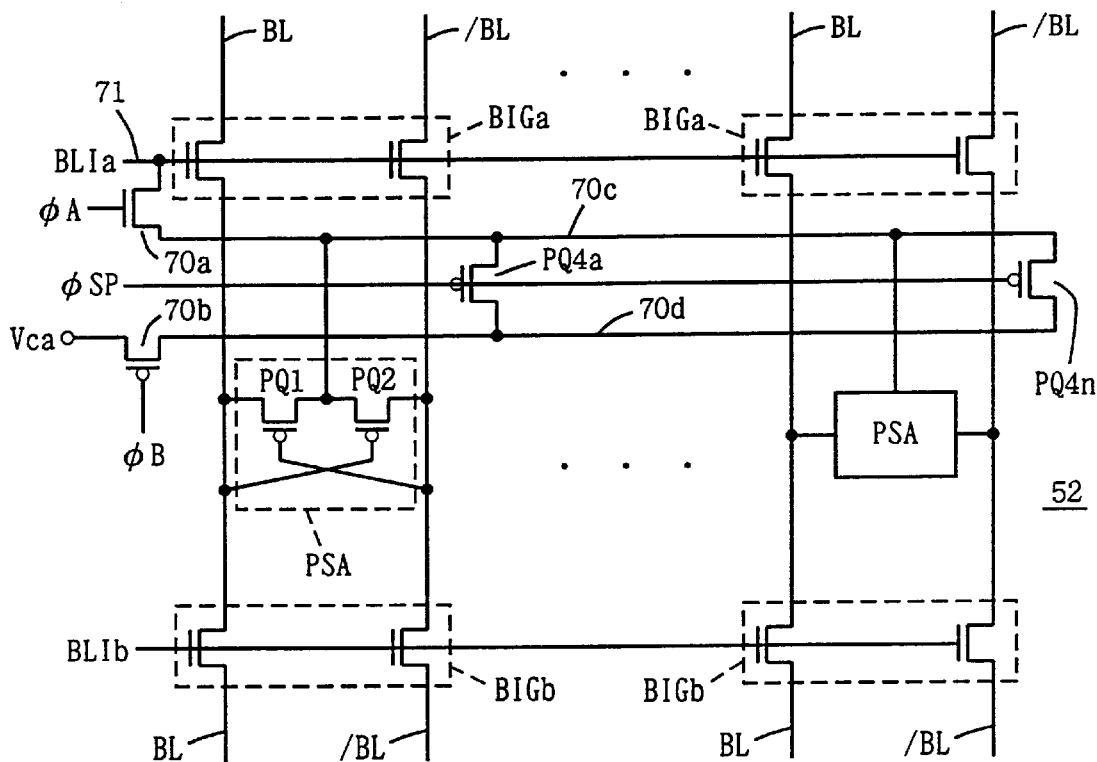
FIG. 25 shows another structure of a main portion of a semiconductor device according to an embodiment 3 of the invention.

Another reference voltage may be used instead of voltage Vpp. [Modification 1]FIG. 25 schematically shows a structure of a modification of the semiconductor device according to the embodiment 3 of the invention. In FIG. 25, a sense drive line 70c and a sense power supply line 70d extending in the row direction are arranged in sense amplifier band 52 for switching the sense power supply voltage. Sense drive line 70c is connected to a signal line 71 transmitting bit line isolation instructing signal BLIa through a switching transistor 70a turned on when a control signal φA is active. Sense power supply line 70d receives sense power supply voltage Vca through switching transistor 70b selectively turned on in response to a control signal φB. Switching transistor 70a is formed of an n-channel MOS transistor, and switching transistor 70b is formed of a p-channel MOS transistor.

Sense activating transistors PQ4a . . . PQ4n formed of p-channel MOS transistors, which are turned on in response to sense amplifier activating signal φSP, are arranged in parallel between sense drive line 70c and sense power supply line 70d.

Figure 26:
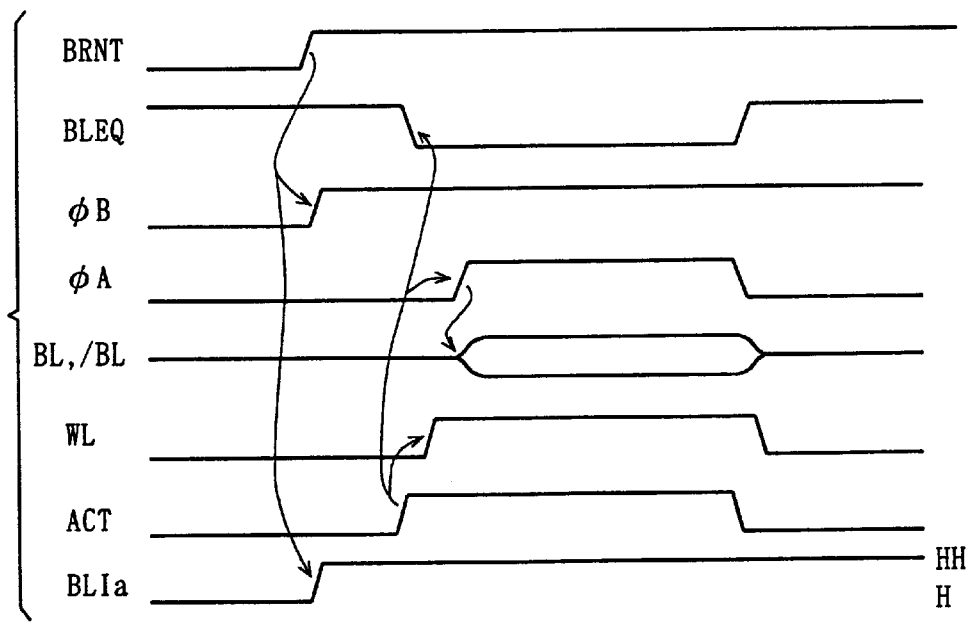
FIG. 26 is a signal waveform diagram representing an operation of the semiconductor device shown in FIG. 25.

A P-sense amplifier PSA formed of cross-coupled p-channel MOS transistors PQ1 and PQ2 is arranged corresponding to each bit line pair BL and /BL. P-sense activating transistors PQ4a –PQ4n may be arranged corresponding to P-sense amplifiers PSA, respectively, or may be arranged such that each P-sense activating transistor PQ4 is arranged for a predetermined number of P-sense amplifiers PSA. Sense drive line 70c is coupled to the sources (sense operation nodes) of MOS transistors PQ1 and PQ2 in each P-sense amplifier PSA. Now, the operation of the semiconductor device shown in FIG. 25 will be described below with reference to an operation waveform diagram of FIG. 26.

In the normal operation, sense activating transistors PQ4a –PQ4n couple sense drive line 70c to sense power supply line 70d in response to activation of sense amplifier activating signal 4SP, and the senseing operation is performed (control signals φA and φB are at L-level, and sense power supply line 70d receives voltage Vca).

When burn-in test mode is selected, burn-in mode instructing signal BRNT attains the active state of H-level. In accordance with burn-in mode instructing signal BRNT, control signal φB attains H-level, and switching transistor 70b is turned off so that sense power supply line 70d is isolated from the sense amplifier power supply circuit.

In this state, the externally applied power supply voltage is raised so that all the internal power supply voltages are raised. The memory cell select instruction is given. Responsively, array activating signal ACT attains H-level, and bit line equalize instructing signal BLEQ attains L-level so that bit lines BL and /BL attain the electrically floating state at an intermediate voltage level. Then, a predetermined number of word lines WL are selected, and data of the memory cells connected to the selected word lines are read onto corresponding bit line pairs BL and /BL.

Then, control signal φA is driven to H-level for performing the sense operation, and bit line isolation instructing signal BLIa at the level of high voltage Vpp is applied to sense drive line 70c. The sense drive line 70c is connected to the sense drive node of P-sense amplifier PSA (i.e., a connection node between MOS transistors PQ1 and PQ2) so that P-sense amplifier PSA is activated to differentially amplify the potentials on corresponding bit lines BL and /BL. When a predetermined period elapses, array activating signal ACT attains the inactive state of L-level, word lines WL are driven to the unselected state, and control signal φA is driven to the inactive state of L-level. Sense drive line 70c is isolated from bit line isolation instructing signal line 71. Bit line equalize instructing signal BLEQ returns from L-level to H-level, and each bit line pair is precharged and equalized to the intermediate voltage level, so that one operation cycle is completed. The above operation is repeated until all the word lines are driven to the selected state while burn-in test mode instructing signal BRNT is active.

In the structure shown in FIG. 25, merely bit line isolation instructing signal BLIa is transmitted to sense drive line 70c instead of sense power supply voltage Vca, but high voltage Vpp can be accurately transmitted by the simple circuit structure.

Figure 27:
FIG. 27 schematically shows a structure of a portion generating a control signal φB shown in FIG. 25.

FIG. 27 schematically shows a structure of a portion generating control signal φB. In FIG. 27, control signal φB is produced from a switching control circuit 80 buffering burn-in mode instructing signal BRNT. Therefore, control signal φB is set to H-level when the burn-in mode is selected and burn-in mode instructing signal BRNT attains the active state of H-level.

Figure 28:
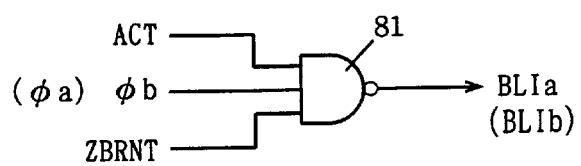
FIG. 28 schematically shows a structure of a bit line isolation instructing signal generating portion shown in FIG. 25.

FIG. 28 schematically shows a structure of the bit line isolation instructing signal generating portion. In FIG. 28, the bit line isolation instructing signal generating portion includes an NAND circuit 81 receiving array activating signal ACT, array designating signal φb and burn-in mode instructing signal ZBRNT. NAND circuit 81 generates bit line isolation instructing signal BLIa. A similar structure is provided for bit line isolation instructing signal BLIb. Thus, bit line isolation instructing signal BLIb is produced by merely using array designating signal φa instead of array designating signal φb.

In FIG. 28, when the burn-in mode is designated, burn-in mode instructing signal ZBRNT attains the active state of L-level, and both bit line isolation instructing signals BLIa (and BLIb) from NAND circuits 81 are held at H-level of high voltage Vpp. When the burn-in mode is designated, both the memory arrays using the common sense amplifier band are connected to the sense amplifier band. In the burn-in test mode, the purpose is to accelerate the voltage stress of each circuit, and fast writing and reading of the memory cell data are not required so that no problem substantially occurs.

Figure 29:
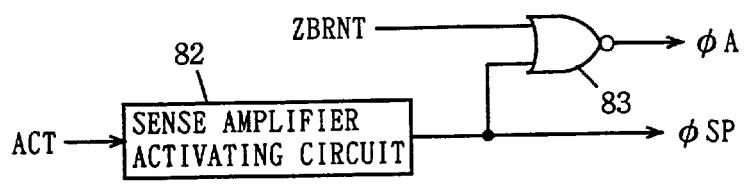
FIG. 29 schematically shows a structure of a portion generating a control signal φA shown in FIG. 25.

FIG. 29 schematically shows a structure of a portion generating control signal φA. In FIG. 29, the portion generating control signal φA includes a sense amplifier activating circuit 82 for delaying array activating signal ACT by a predetermined time to produce sense amplifier activating signal φSP, and an NOR circuit 83 receiving sense amplifier activating signal φSP from sense amplifier activating circuit 82 and burn-in mode instructing signal ZBRNT. NOR circuit 83 generates control signal φA. Sense amplifier activating signal φSP is driven to the active state of L-level when a predetermined period elapses after activation of array activating signal ACT. Burn-in mode instructing signal ZBRNT is at L-level when it is active. Therefore, control signal φA is driven to the active state of H-level upon each activation of sense amplifier activating signal φSP, and the bit line isolation instructing signal is coupled to the sense drive line. During the sensing operation, sense activating transistors PQ4a –PQ4n may be in either the on or off state.

Figure 30:
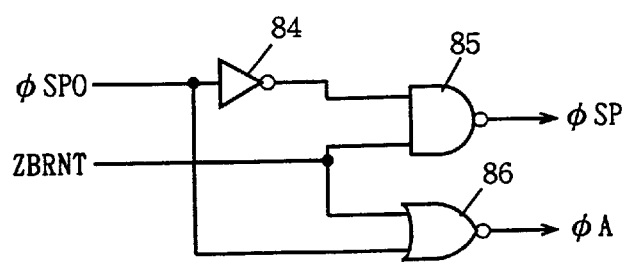
FIG. 30 schematically shows another structure of the portion generating control signal φA.

FIG. 30 schematically shows another structure of the sense amplifier activating circuit. In FIG. 30, the structure includes an inverter 84 receiving a sense amplifier activating signal φSPO from sense amplifier activating circuit 82, an NAND circuit 85 receiving the output signal of inverter 84 and burn-in mode instructing signal ZBRNT, to generate sense amplifier activating signal φSP, and an NOR circuit 86 receiving sense amplifier activating signal φSPO and burn-in mode instructing signal ZBRNT, to generate control signal φA.

In FIG. 30, the burn-in mode is designated, sense amplifier activating signal φSP from NAND circuit 85 is fixed to H-level. Control signal φA is activated and attains H-level in accordance with sense amplifier activating signal φSPO from the sense amplifier activating circuit. In this state, sense amplifier activating signal φSP is not activated, and sense amplifier activating transistors PQa –PQn maintain the off state. The structure shown in FIG. 30 can also achieve the voltage stress acceleration of MOS transistors PQ1 and PQ2 included in P-sense amplifier PSA.

Figure 31:
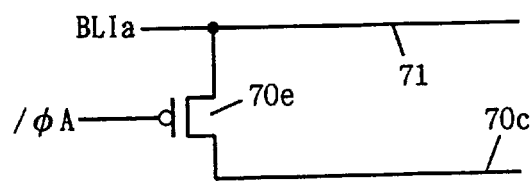
FIG. 31 schematically shows a structure of a modification of a main portion of the semiconductor device shown in FIG. 25.

FIG. 31 shows a structure of a modification of the sense power supply switching portion. In the structure shown in FIG. 31, a switching transistor 70e formed of a p-channel MOS transistor is arranged between a bit line isolation instruction signal line 71 and sense drive line 70c. Switching transistor 70e receives on its gate a complementary control signal /φA. In the structure shown in FIG. 31, high voltage Vpp on bit line isolation instructing signal BLIa can be transmitted onto sense drive line 70c without causing a loss of threshold voltage, and the voltage acceleration can be achieved further efficiently.

[Modification 2]

FIG. 32 shows an operation of a modification 2 of a semiconductor device according to an embodiment 3 of the invention. In FIG. 32, when the burn-in mode setting signal is activated, bit line equalize instructing signal BLEQ attains the inactive state of L-level, and each of bit lines BL and /BL is held in the electrically floating state. In this state, control signals φB and φA are successively driven to H-level. Thereby, sense drive line 70c (see FIG. 25) is supplied with bit line isolation instructing signal BLIa so that P-sense amplifier PSA is activated and performs the sense operation. Array activating signal ACT is held in the inactive state of L-level so that word line WL is not selected, and maintains the inactive state of L-level. One of bit lines BL and /BL is driven to the level of high voltage Vpp in accordance with the characteristics of P-sense amplifier. The other bit line holds the intermediate voltage level. When burn-in mode instructing signal BRNT attains the inactive state of L-level, bit line equalize instructing signal BLEQ attains H-level again, and control signals φA and φB attain L-level so that bit lines BL and /BL are held at the voltage level of intermediate voltage (Vca/s) again.

According to the operation shown in FIG. 32, the word line is unselected, and high voltage Vpp is not transmitted to the memory cell capacitor so that breakdown of the capacitor insulating film due to application of high voltage Vpp can be prevented. The voltage stress acceleration can be executed on the source/drain junctions of p-channel MOS transistors PQ1 and PQ2 included in P-sense amplifier as well as the contacts between the source and drain regions, the gate contact portions between the transistors and the bit lines. This mode is a voltage stress acceleration mode dedicated to the P-sense amplifier PSA. Thereby, a contact resistance failure at the contact portion and others can be revealed, and the pn junction failure can be revealed. In particular, the P-sense amplifier flows large charging current during operation. Therefore, if the contact failure occurred at the contact portion, an interconnection line might be broken due to heating caused by such large charging current of the bit line, and therefore a failure might occur in the semiconductor device during actual operation. Owing to provision of the voltage stress acceleration mode dedicated to the P-sense amplifier PSA, a latent defect in the P-sense amplifier portion can be revealed, and the reliability of the semiconductor device can be improved.

FIG. 33 schematically shows a structure of a bit line equalize instructing signal generating portion. More specifically, FIG. 33 schematically shows a structure of a bit line equalize/precharge circuit. A bit line equalize/precharge circuit 94 in FIG. 33 includes an n-channel MOS transistor NT1 turned on in response to bit line equalize instructing signal BLEQ to electrically short-circuit bit lines BL and /BL, and n-channel MOS transistors NT2 and NT3 turned on in response to bit line equalize instructing signal BLEQ to transmit a bit line precharge voltage Vb1 to bit lines BL and /BL, respectively.

The bit line equalize instructing signal generating portion includes a bit line equalize control circuit 90 for producing a bit line equalize control signal φC in response to array activating signal ACT, and an AND circuit 92 receiving bit line equalize control signal φC from bit line equalize control circuit 90 and burn-in mode instructing signal ZBRNT, to generate bit line equalize instructing signal BLEQ. Bit line equalize control circuit 90 is formed of an inverter circuit, and inverts array activating signal ACT to produce bit line equalize control signal φC.

In the structure shown in FIG. 33, when burn-in mode instructing signal ZBRNT attains the active state of L-level, bit line equalize instructing signal BLEQ attains L-level, and bit line equalize/precharge signal 94 is deactivated so that bit lines BL and /BL are electrically floated at the voltage level of their precharge voltage Vb1 (=Vca/2 ). In the normal operation mode, burn-in mode instructing signal ZBRNT is at H-level, and bit line equalize instructing signal BLEQ is produced in accordance with bit line equalize control signal φC from bit line equalize control circuit 90.

In the structure shown in FIG. 33, the array designating signal may be further applied to AND circuit 92, and array bit line equalize instructing signal BLEQ for the unselected memory may be held at H-level (in the normal operation mode).

In the structure of the modification 2 described above, both the memory arrays using the common sense amplifier band are connected to the sense amplifier band, and are simultaneously subjected to the voltage stress acceleration of the bit lines.

In the structure of the modification 2, the P-sense amplifier is activated after bit lines BL and /BL are electrically floated at the level of intermediate voltage Vb1. In this case, one of bit lines BL and /BL is driven to H-level owing to the characteristics of P-sense amplifier. Therefore, the contact portion which is always subjected to the voltage stress acceleration is determined by the characteristics (offset of the threshold voltage) of the P-sense amplifier. In order to avoid this, such a structure may be employed that column-related circuits are activated to write data of 1 or 0 into the sense node of the sense amplifier through the write/read circuit when burn-in mode instructing signal BRNT is active, and thereafter the voltage stress acceleration is performed. In this case, the voltage stress corresponding to the data can be reliably applied to bit lines BL and /BL. The above structure can be accomplished by merely carrying out the logical OR operation on array activating signal ACT and burn-in mode instructing signal BRNT, and using the resultant signal as the column-related circuit enable signal (usually, in semiconductor memory device, the column selection is enabled only when array activating signal ACT is activated). In a synchronous semiconductor memory device or the like, column-related circuits operate independently of row-related circuits. In this case, a data write command may be externally applied when burn-in mode instructing signal BRNT is active, and thereby data of 1 or 0 may be written into the sense node. Thereafter, the voltage level of external power supply voltage is raised.

[Modification 3]

FIG. 34 schematically shows a structure of a modification 3 of the embodiment 3 of the invention. In the structure shown in FIG. 34, sense drive line 70c is supplied with bit line isolation instructing signal BLIa through a switching transistor 70y formed of a p-channel MOS transistor and turned on in response to a control signal /φAa, and is also supplied with bit line isolation instructing signal BLIb through a switching transistor 70z formed of a p-channel MOS transistor and turned on in response to a control signal /φAb. Sense power supply line 70d is supplied with sense power supply voltage Vca through a switching transistor 70x formed of a switching p-channel MOS transistor and selectively turned on in response to control signal φB.

In the structure shown in FIG. 34, bit line isolation instructing signal BLIa for the array including a selected memory cell maintains H-level. One of bit line isolation instructing signal BLIb maintains L-level. In the burn-in test mode, control signal /φAa or /φAb for the switching transistor, which is provided corresponding to bit line isolation instructing signal BLIa or BLIb maintaining H-level, is driven to L-level. Therefore, when bit line isolation instructing signals BLIa and BLIb are, for example, at H- and L-levels, respectively, control signal /φAa is at L-level, and control signal /φAb is at L-level. Sense drive line 70c is supplied with bit line isolation instructing signal BLIa at H-level. When bit line isolation instructing signals BLIa and BLIb are at L- and H-levels, respectively, switching transistor 70z is turned on, and switching transistor 70y is kept off. In either case, sense drive line 70c is supplied with the bit line isolation instructing signal at the level of high voltage Vpp. In the structure shown in FIG. 34, the burn-in test can be performed by a memory array at a time. Even when a word line is held in the unselected state, the voltage stress acceleration of the bit line can be performed by a memory cell array at a time. When one of memory arrays 50a and 50b includes the selected memory cell, the corresponding bit line isolation instructing signal is driven to H-level.

Figure 35:
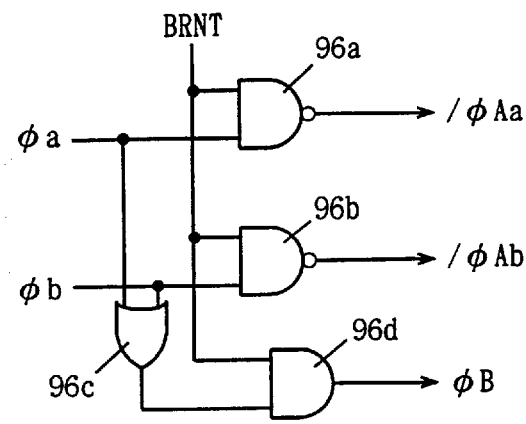
FIG. 35 schematically shows a structure of a portion generating a control signal shown in FIG. 34.

FIG. 35 shows an example of the structure of the control signal generating portion shown in FIG. 34. In FIG. 35, control signal /φAa is generated from an NAND circuit 96a receiving burn-in mode instructing signal BRNT and memory array designating signal φA. Control signal /φAb is generated from an NAND circuit 96b receiving burn-in mode instructing signal BRNT and memory array designating signal φB. Control signal φB is produced by an OR circuit 96c receiving array designating signals φA and φB as well as an NAND circuit 96d receiving the output signal of OR circuit 96c and burn-in mode instructing signal BRNT.

When burn-in mode instructing signal BRNT is in the inactive state of L-level, control signals /Aa and /Ab are at H-level. Switching transistors 70y and 70z shown in FIG. 30 are off. Control signal φB is at L-level, and sense power supply line 70d receives sense power supply voltage Vca.

When burn-in mode instructing signal BRNT attains H-level, control signals /φAa and /φAb are selectively driven to the active state in accordance with array designating signals φA and φB. For example, when array designating signal φA attains H-level, control signal φAa attains L-level so that switching transistor 74y shown in FIG. 30 is turned on to transmit bit line isolation instructing signal BLIa to sense drive line 70c. At this time, control signal φB is at H-level, and switching transistor 70x is off.

Bit line isolation instructing signals BLIa and BLIb are produced from the same circuit structure as that already described with reference to FIG. 28.

In the structure shown in FIGS. 34 and 35, therefore, the burn-in test can be performed by an array at a time.

The above structure can be applied to such a device, in which a plurality of memory arrays are aligned in the column direction, and sense amplifier bands arranged between the adjacent memory arrays are large in number. In this case, only a required sense amplifier band can be operated so that flow of large sense charging/discharging currents can be prevented. In the case where the shared sense amplifiers are in the alternate arrangement, the sense amplifier bands at the opposite sides of one memory array can be connected to the selected memory array for performing the burn-in test.

Figure 36:
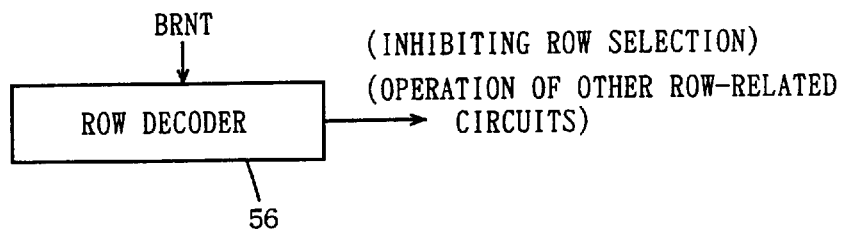
FIG. 36 schematically shows a structure of a portion implementing operation waveforms shown in FIG. 32.

In the structure shown in FIGS. 30 and 35, memory array designating signals φa and φb must be produced. When the word lines are to be held in the unselected state, the row selecting operation must be inhibited in accordance with burn-in mode instructing signal BRNT. This can be accomplished merely by such a structure that burn-in mode instructing signal BRNT is applied to the row decode circuit for stopping the decoding operation. Only the memory array designating signal is produced. At this time, the sense amplifier activating signal may be produced (see FIG. 36).

[Modification 4]

Figure 37:
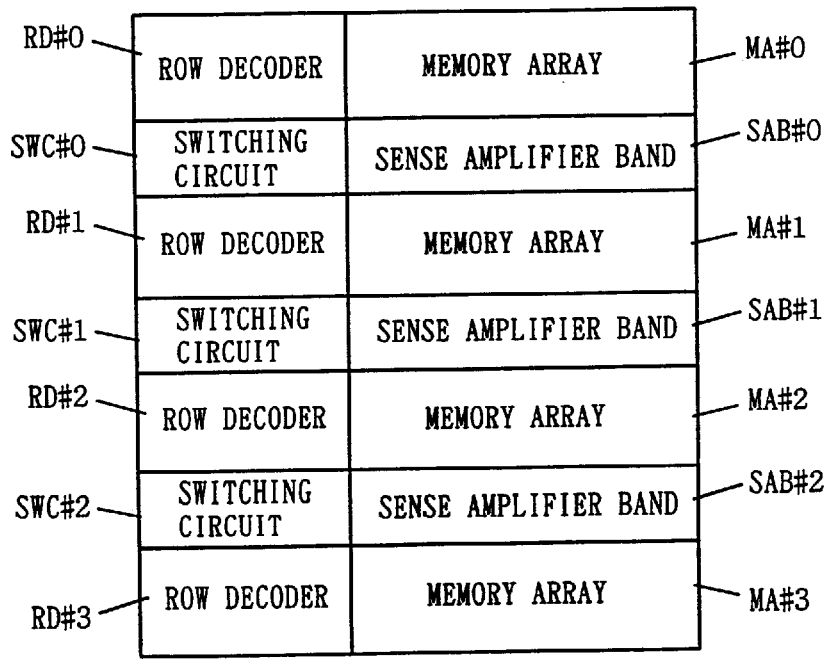
FIG. 37 schematically shows a structure of a main portion of a modification 4 of the semiconductor device according to the embodiment 3 of the invention.

FIG. 37 schematically shows a structure of an array portion of a semiconductor memory device according to a modification 4 of the embodiment 3 of the invention. In FIG. 37, a memory mat is divided into a plurality of (four) memory arrays MA#0–MA#3. Sense amplifier bands SAB#0–SAB#2 are arranged between memory arrays MA#0–MA#3. Each of sense amplifier bands SAB#0–SAB#2 is commonly used by the memory arrays on the opposite sides thereof.

Row decoders RD#0–RD#3 are arranged corresponding to memory arrays MA#0–MA#3, respectively. Switching circuits SWC#0–SWC#2 are facing to sense amplifier bands SAB#0–SAB#2, respectively, and are arranged alignedly with row decoders RD#0–RD#3. Each of switch circuits SWC#0–SWC#2 includes the switching transistor and the control circuit for switching the sense voltage. In the arrangement shown in FIG. 37, the switch circuits are arranged corresponding to sense amplifier bands SAB#0–SAB#2 and are located between the row decoders. Generally, the region facing to the sense amplifier bands SAB#0–SAB2 is occupied only by the sense amplifier control circuits, and a relatively large empty region is present therein. By utilizing this region for arranging switch circuits SWC#0–SWC#2, switch circuits SWC#0–SWC#2 for switching the sense power supply voltage can be arranged without increasing the memory mat area.

In the foregoing description, the bit line isolation instructing signals are selectively used as the sense power supply voltage. Alternatively, the circuit generating the bit line isolation instructing signal may be supplied with high voltage Vpp, and high voltage Vpp may be transmitted instead of sense power supply voltage Vca.

This can be achieved merely by using high voltage Vpp instead of bit line isolation instructing signal BLIa.

According to the embodiment 3 of the invention, as described above, the sense power supply voltage is set to a signal at the internal high voltage level during the accelerated test mode such as a burn-in mode. Therefore, the voltage stress acceleration of the sense amplifier can be performed efficiently, and the test time can be reduced. Further, acceleration on the necessary portions (contact holes and junction regions in the sense amplifier portion) can be performed efficiently so that screening of the sense amplifier portion having a latent defect can be reliably performed, and the semiconductor memory device of high reliability can be achieved.

In the structure shown in FIG. 37, the sense amplifier band is used merely by the adjacent memory arrays. Sense amplifier bands SAB#0–SAB#2 may have a structure of a so-called "alternately arranged shared sense amplifier arrangement".

As described above, the invention can provide the semiconductor device which allows accurate execution of intended tests without requiring increase in chip area.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:

tuning signal generating circuitry activated in response to a tuning mode instructing signal to transmit a tuning signal for tuning a voltage between predetermined circuit nodes onto a tuning signal line; and test mode activating circuitry responsive to a test mode instructing signal for generating onto said tuning signal line a signal for activating a test mode designated by said test mode instructing signal.

2. The semiconductor device according to claim 1, further comprising:

circuitry responsive to the signal on said tuning signal line being active for generating a test mode setting signal for placing said semiconductor device into a state operable in the test mode designated by said test mode instructing signal.

3. The semiconductor device according to claim 1, wherein said tuning signal is a signal for short-circuiting said predetermined circuit nodes.

4. The semiconductor device according to claim 1, wherein said turning signal generating circuitry includes an output circuit activated in response to said turning mode instructing signal for generating the turning signal corresponding to a signal applied at a pad, and said output circuit enters an output high impedance state when said turning mode instructing signal is deactivated.

5. The semiconductor device according to claim 1, further comprising isolation circuitry coupled between said predetermined nodes and said turning signal line for isolating said predetermined nodes from said turning signal line in response to deactivation of said turning mode instructing signal.

6. A semiconductor device comprising:

a memory array including a plurality of memory cells arranged in rows and columns;

a plurality of bit line pairs provided correspondingly to the columns of said memory cells, each of the bit line pairs connected to the memory cells in a corresponding column;

a plurality of sense amplifiers provided corresponding to said bit line pairs, each of the sense amplifiers activated in accordance with a voltage on a sense drive node to perform differential amplification of potentials on a corresponding bit line pair;

a sense power supply for generating a power supply voltage for the sense amplifiers;

circuitry for internally generating an internal voltage at a level different from said power supply voltage; and transmission circuitry activated in response to activation of a test mode instructing signal to transmit said internal voltage to said sense drive node.

7. The semiconductor device according to claim 6, wherein said internal voltage is higher than said power supply voltage.

8. The semiconductor device according to claim 6, further comprising:

a bit line isolation gate arranged between a sense amplifier of the sense amplifiers and a corresponding bit line pair for isolating said sense amplifier from the corresponding bit line pair in response to activation of a bit line isolation instructing signal, and said bit line isolation instructing signal being held at a level of said internal voltage when inactive, said transmitting circuitry including a circuit for transmitting said bit line isolation instructing signal to said sense drive node.

9. The semiconductor device according to claim 6, further comprising:

a plurality of word lines provided corresponding to the rows of the memory cells of said memory array, each of the word lines connected to the memory cells in a corresponding row; and control circuitry for holding said plurality of word lines in an unselected state in response to said test mode instructing signal being active.

10. The semiconductor device according to claim 8, wherein said transmission circuitry includes:

a first power supply line provided commonly to said plurality of sense amplifiers for transmitting the voltage from said sense power supply;

a second power supply line provided for said plurality of sense amplifiers and coupled to the sense drive nodes of said plurality of sense amplifiers;

a first element for coupling the first and second power supply lines together in response to a sense amplifier activating signal; and a switching circuit configured to be responsive to said test mode instructing signal for isolating the first power supply line from said sense power supply and connecting a signal line transmitting said bit line isolation instructing signal to the second power supply line.

11. The semiconductor device according to claim 10, wherein said switching circuit is arranged outside a sense amplifier band including said plurality of sense amplifiers, and is aligned with said sense amplifier band.

12. The semiconductor device according to claim 1, wherein the tuning mode instructed by the tuning mode instructing signal, and said test mode are operation modes performed independently of each other.

13. The semicondutor device according to claim 6, wherein said transmission circuitry transmits the internal voltage to said sense drive node, in place of said power supply voltage in a test mode designated by said test mode instructing signal.

* * * * *